US008470670B2

(12) United States Patent
Power et al.

(10) Patent No.: US 8,470,670 B2
(45) Date of Patent: Jun. 25, 2013

(54) METHOD FOR MAKING SEMICONDUCTOR DEVICE

(75) Inventors: John Power, Dresden (DE); Danny Pak-Chum Shum, Poughkeepsie, NY (US); Wolfgang Dickenscheid, Dresden (DE); Robert Strenz, Radebeul (DE)

(73) Assignee: Infineon Technologies AG, Neubiberg (DE)

( * ) Notice: Subject to any disclaimer, the term of this patent is extended or adjusted under 35 U.S.C. 154(b) by 281 days.

(21) Appl. No.: 12/565,459

(22) Filed: Sep. 23, 2009

(65) Prior Publication Data

US 2011/0070726 A1 Mar. 24, 2011

(51) Int. Cl.
*H01L 21/336* (2006.01)

(52) U.S. Cl.
USPC ...................... 438/267; 438/596; 257/E21.69

(58) Field of Classification Search
USPC .......................................... 438/267, 304, 596
See application file for complete search history.

(56) References Cited

U.S. PATENT DOCUMENTS

| | | | | |
|---|---|---|---|---|
| 4,794,565 | A | 12/1988 | Wu et al. | |
| 5,073,513 | A | 12/1991 | Lee | |
| 5,429,971 | A * | 7/1995 | Yang | 438/258 |
| 6,043,530 | A | 3/2000 | Chang | |
| 6,160,287 | A | 12/2000 | Chang | |
| 6,291,297 | B1 | 9/2001 | Chen | |
| 7,268,042 | B2 * | 9/2007 | Hisamoto et al. | 438/267 |
| 7,397,080 | B2 | 7/2008 | Wong et al. | |
| 7,416,945 | B1 * | 8/2008 | Muralidhar et al. | 438/267 |
| 2006/0011967 | A1 | 1/2006 | Shone | |
| 2006/0071265 | A1 | 4/2006 | Koh | |
| 2006/0166420 | A1 | 7/2006 | Van Duuren et al. | |
| 2008/0029805 | A1 | 2/2008 | Shimamoto et al. | |
| 2008/0149987 | A1 | 6/2008 | Alapati et al. | |
| 2009/0039410 | A1 | 2/2009 | Liu et al. | |
| 2009/0134449 | A1 | 5/2009 | Arigane et al. | |

FOREIGN PATENT DOCUMENTS

| | | | |
|---|---|---|---|
| EP | 0335395 | A2 | 10/1989 |
| EP | 0531526 | A1 | 3/1993 |

* cited by examiner

*Primary Examiner* — Chandra Chaudhari
(74) *Attorney, Agent, or Firm* — Infineon Technologies; Philip H. Schlazer

(57) ABSTRACT

One or more embodiments may relate to a method for making a semiconductor device, including: a method for making a semiconductor device, comprising: providing a substrate; forming a charge storage layer over the substrate; forming a control gate layer over the charge storage layer; forming a mask over the control gate layer; using the mask, etching the control gate layer and the charge storage layer; forming a select gate layer over the etched control gate layer and the etched charge storage layer; forming an additional layer over the select gate layer; etching the additional layer to form sidewall spacers over the select gate layer; and etching the select gate layer.

28 Claims, 17 Drawing Sheets

METHOD FOR MAKING SEMICONDUCTOR DEVICE

FIELD OF THE INVENTION

Generally, the present invention relates to semiconductor devices and methods of making semiconductor devices.

BACKGROUND OF THE INVENTION

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

One type of semiconductor device is a memory device, in which data is typically stored as a logical "1" or "0". One type of memory device is a charge storage memory device. An example of a charge storage memory device is a floating gate device. It is possible that the floating gate may be in a double stacked gate device. Another example of a charge storage memory device is a charge trapping device.

DETAILED DESCRIPTION OF THE INVENTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

In this document, the terms "a" or "an" are used, as is common in patent documents, to include one or more than one. In this document, the term "or" in used to refer to "non-exclusive or", such that "A or B" includes "A but not B", "B but not A", and "A and B", unless otherwise indicated.

Figure 1:
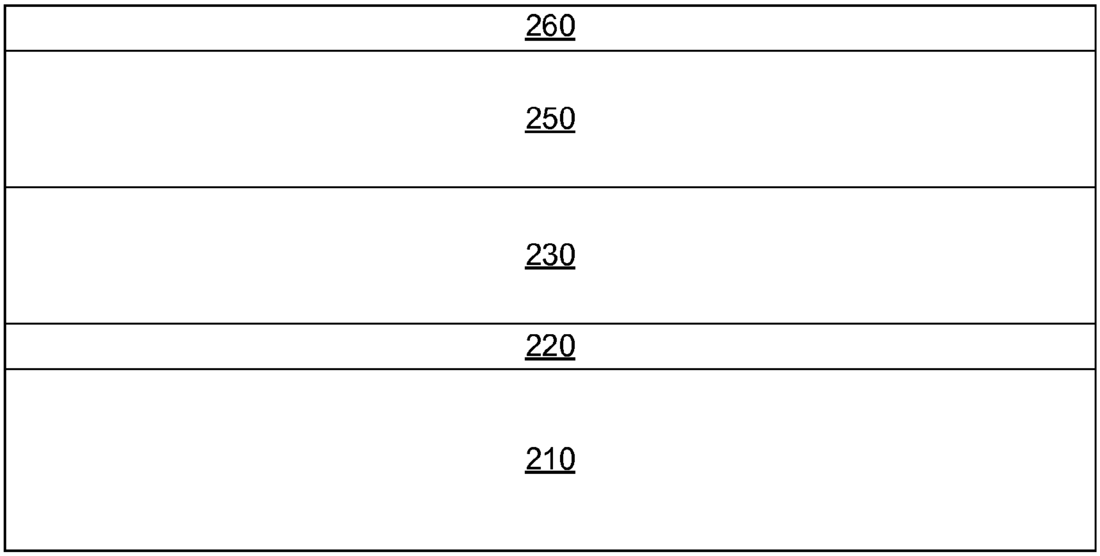
FIGS. 1 through 11, 12A, 13A, 14A, 15A, 16A, 12B, 13B, 14B, 15B and 16B show methods for making semiconductor devices in accordance with embodiments of the present invention.

Referring to FIG. 1, a semiconductor substrate 210 is provided. The substrate 210 may be any type of substrate. The substrate 210 may be a semiconductor substrate. The substrate 210 may be a silicon substrate (for example, a bulk silicon substrate). In an embodiment, the substrate 210 may be a p-type substrate. The substrate may be a bulk mono-crystalline silicon substrate (or a layer grown thereon or otherwise formed therein), a layer of (110) silicon on a (100) silicon wafer, a silicon-on-insulator (SOI) substrate. The SOI substrate may, for example, be formed by a SIMOX process, or by wafer bonding followed by the removal of excess silicon from one of the wafers. The substrate may be a silicon-on-sapphire (SOS) substrate. The substrate may be a germanium-on-insulator (GeOI) substrate. The substrate may include one or more materials such as semiconductor materials such as silicon germanium, germanium, germanium arsenide, indium arsenide, indium arsenide, indium gallium arsenide, or indium antimonide.

Next, a first dielectric layer 220 is formed over the substrate 210. In one or more embodiments, the first dielectric layer 220 may comprise an oxide (such as silicon dioxide $SiO_2$), a nitride (such as silicon nitride, $Si_3N_4$ or $Si_xN_y$), an oxynitride (such as silicon oxynitride, S—O—N or $SiO_xN_y$), an oxide/nitride stack such as a $SiO_2/Si_xN_y$ stack (where the layers may be in any order), an oxide/nitride/oxide stack (for example, an ONO stack) or combinations thereof.

In one or more embodiments, the first dielectric layer 220 may comprise a high-k dielectric material. The high-k material may have a dielectric constant greater than 3.9. The high-k material may have a dielectric constant greater than silicon dioxide. The high-k material may comprise a hafnium-based material. The high-k material may comprise one or more of the elements Hf, Al, Si, Zr, O, N, Ta, La, Ti, Y, Pr, Gd and combinations thereof. The high-k material may comprise HfSiON, HfSiO, $HfO_2$, $HfSiO_x$, $HfAlO_x$, $HfAlO_xN_y$, $HfSiAlO_x$, $HfSiAlO_xN_y$, $Al_2O_3$, $ZrO_2$, $ZrSiO_x$, $Ta_2O_5$, $SrTiO_3$, $La_2O_3$, $Y_2O_3$, $Gd_2O_3$, $Pr_2O_3$, $TiO_2$, $ZrAlO_x$, $ZrAlO_xN_y$, $SiAlO_x$, $SiAlO_xN_y$, $ZrSiAlO_x$, $ZrSiAlO_xN_y$, or combinations thereof. The high-k material may comprise $Al_2O_3$. In one or more embodiments, the first dielectric layer 220 may comprise any other dielectric material or high-k dielectric material. In one or more embodiments, the first dielectric layer 220 may comprise an oxide/high-k stack such as a $SiO_2/Al_2O_3$ stack.

In one or more embodiments, the first dielectric layer 220 may have a thickness of at least 4 nm (nanometers). In one or more embodiments, the first dielectric layer 220 may have a thickness of at least 6 nm. In one or more embodiments, the first dielectric layer may have a thickness of at least 8 nm. In one or more embodiments, the first dielectric layer may have a thickness of less than about 15 nm. In one or more embodiments, the first dielectric layer may have a thickness of less than about 12 nm. In one or more embodiments, the first dielectric layer may comprise a single layer of material or it may comprise two or more layers of material.

The first dielectric layer 220 may be formed in many different ways. For example, the first dielectric layer 220 may be grown by a thermal oxidation, deposited by a chemical vapor deposition (CVD), atomic layer deposition (ALD), physical vapor deposition (PVD), or a jet vapor deposition. Hence, the first dielectric layer may be formed by a growth process or by a deposition process.

A high-k material may be formed, for example, by a deposition process. Examples of deposition process which may be used include chemical vapor deposition (CVD), physical vapor deposition (PVD), atomic layer deposition (ALD), molecular beam epitaxy (MDE), or other deposition processes.

In one or more embodiments, the first dielectric layer 220 may serve as a tunneling dielectric layer for a floating gate memory device. In another embodiment of the invention, the first dielectric layer 220 may serve as a tunneling dielectric layer for a charge trapping memory device.

Next, a charge storage layer 230 may be formed over the first dielectric layer 220. In one or more embodiments, the charge storage layer may comprise, for example, a polysilicon material. The polysilicon may be doped with an n-type dopant (such as phosphorus) or a p-type dopant (such as boron). The doping may be accomplished using an ion implantation process or it may be done in-situ. In one or more embodiments, in-situ doping involves the addition of dopant gases such as phosphine and diborane to the CVD reactant gases used in polysilicon deposition.

In one or more embodiments, the charge storage layer 230 may comprise any conductive material. In one or more embodiments, the charge storage layer 230 may comprise a metallic material such as a pure metal or a metal alloy. In one or more embodiments, the charge storage layer may comprise a semiconductor material. In one or more embodiments, it is possible that the charge storage layer 230 may comprise a dielectric material. In one or more embodiments, the charge storage layer 230 may comprise a metal silicide or a metal nitride.

In one or more embodiments, the charge storage layer 230 may comprise TiN, TiC, HfN, TaN, TaC, TaN, W, Al, Ru, RuTa, TaSiN, NiSix, CoSix, $TiSi_x$, Ir, Y, Pt, I, Pt, Ti, Pd, Re, Rh, borides of Ti, borides of Hf, borides of Zr, phosphides of Ti, phosphide of Hf, phoshides of Zr, antimonides of Ti, antimonides of Hf, antimonides of Zr, TiAlN, Mo, MoN, ZrSiN, ZrN, HfN, HfSiN, WN, Ni, Pr, VN, TiW, and/or combinations thereof.

In one or more embodiments, the charge storage layer 230 may comprise a nitride. In one or more embodiments, the charge storage layer 230 may comprise a nanocrystalline material. In one or more embodiments, the charge storage layer 230 may comprise a high-k dielectric material.

The charge storage layer 230 may comprise a single layer or a plurality of stacked layers (such as a polysilicon layer disposed over a metal layer). In one or more embodiments, the thickness of the charge storage layer 230 may be about 30 nm to about 300 nm, however, other thicknesses are also possible. The charge storage layer 230 may be deposited in many different ways. Examples include chemical vapor deposition, physical vapor deposition and atomic layer deposition. In one or more embodiments, the charge storage layer 230 may be a mixture (such as a heterogeneous mixture) of two or more different materials.

In one or more embodiments, the charge storage layer 230 may serve as a floating gate layer of a floating gate device. In one or more embodiments, the charge storage layer 230 may serve as a charge trapping layer for a charge trapping device. In one or more embodiments, it is possible that any of the materials described above for the charge storage layer may be useful for either a floating gate layer for a floating gate device or as a charge trapping layer for a charge trapping device.

In one or more embodiments, the charge storage layer 230 may serve as a floating gate layer of a floating gate memory device. Hence, the charge storage layer 230 may include any material that can serve as a floating gate for a floating gate memory device.

In one or more embodiments, the floating gate material may comprise, for example, a polysilicon material. The polysilicon material may be polysilicon. The polysilicon may be doped with an n-type dopant (such as phosphorus) or a p-type dopant (such as boron). The doping may be accomplished using an ion implantation process or it may be done in-situ. In one or more embodiments, the in-situ doping may involve the addition of dopant gases such as phosphine and diborane to the CVD reactant gases used in polysilicon deposition.

In one or more embodiments, the floating gate material may comprise any conductive material. In one or more embodiments, the floating gate material may comprise a metallic material such as a pure metal or a metal alloy. In one or more embodiments, the floating gate material may comprise a semiconductor material. In one or more embodiments, it is possible that the floating gate material may comprise a dielectric material. In one or more embodiments, the floating gate material may comprise a metal silicide or a metal nitride.

In one or more embodiments, the floating gate material may comprise TiN, TiC, HfN, TaN, TaC, TaN, W, Al, Ru, RuTa, TaSiN, NiSix, CoSix, $TiSi_x$, Ir, Y, Pt, I, Pt, Ti, Pd, Re, Rh, borides of Ti, borides of Hf, borides of Zr, phosphides of Ti, phosphide of Hf, phoshides of Zr, antimonides of Ti, antimonides of Hf, antimonides of Zr, TiAlN, Mo, MoN, ZrSiN, ZrN, HfN, HfSiN, WN, Ni, Pr, VN, TiW, and/or combinations thereof.

In one or more embodiments, the charge storage layer 230 may serve as a charge trapping layer for a charge trapping memory device. Hence, the charge storage layer may include any material that can serve as a charge trapping layer for a charge trapping memory device. Examples of charge trapping materials include, without limitation, nitrides (such as silicon nitride), nanocrystalline materials and, possibly, certain high-k materials. In one or more embodiments, the charge trapping layer may comprise a dielectric material.

Referring again to FIG. 1, after the formation of the charge storage layer 230, a second dielectric layer 240 may be formed over the charge storage layer 230. In one or more embodiments, the second dielectric layer 240 may be formed by a deposition process. In one or more embodiments, the second dielectric layer 240 may be formed by a growth process. In one or more embodiments, the second dielectric layer 240 may comprise an oxide (such as silicon dioxide $SiO_2$), a nitride (such as $Si_3N_4$ or $Si_xN_y$) an oxynitride (such as silicon oxynitride, S—O—N or $SiO_xN_y$), or combinations thereof. In one or more embodiments, the second dielectric layer 240 may comprise a stack of two or more layers (or a stack of three or more layers) such as an oxide/nitride stack such as a $SiO_2$/$Si_3N_4$ or an $SiO_2$/$Si_xN_y$ stack or a nitride/oxide stack, an oxide/nitride/oxide stack (for example, an ONO stack) or combinations thereof.

In one or more embodiments, the second dielectric layer 240 may comprise a high-k dielectric material. The high-k material may have a dielectric constant greater than 3.9. The high-k material may have a dielectric constant greater than silicon dioxide. The high-k material may comprise a hafnium-based material. The high-k material may comprise one or more of the elements Hf, Al, Si, Zr, 0, N, Ta, La, Ti, Y, Pr, Gd and combinations thereof. The high-k material may comprise HfSiON, HfSiO, $HfO_2$, $HfSiO_x$, $HfAlO_x$, $HfAlO_xN_y$, $HfSiAlO_x$, $HfSiAlO_xN_y$, $Al_2O_3$, $ZrO_2$, $ZrSiO_x$, $Ta_2O_5$, $SrTiO_3$, $La_2O_3$, $Y_2O_3$, $Gd_2O_3$, $Pr_2{}^{O}{}_3$, $TiO_2$, $ZrAlO_x$, $ZrAlO_xN_y$, $SiAlO_x$, $SiAlO_xN_y$, $ZrSiAlO_x$, $ZrSiAlO_xN_y$, or combinations thereof. The high-k material may comprise $Al_2O_3$. Alternatively, the second dielectric layer 240 may comprise any other dielectric material or high-k dielectric material.

In one or more embodiments, the second dielectric layer 240 may have a thickness of at least 4 nm (nanometers). In one or more embodiments, the second dielectric layer may have a thickness of at least 6 nm. In one or more embodiments, the second dielectric layer may have a thickness of at least 8 nm. In one or more embodiment, the second dielectric layer 240 may have a thickness of less than about 20 nm. In one or more embodiments, the second dielectric layer 240 may have a thickness of less than about 15 nm. Other thicknesses are also possible. In one or more embodiments, the second dielectric layer 240 may comprise a single layer of material or it may comprise two or more layers of material.

The second dielectric layer 240 may be formed in many different ways. In one or more embodiments, the second dielectric layer 240 may be formed by deposition process. In one or more embodiments, the second dielectric layer 240 may be formed by a growth process (such as a thermal growth process). For example, the second dielectric layer may be grown by a thermal oxidation, deposited by a chemical vapor deposition (CVD), atomic layer deposition (ALD), physical vapor deposition (PVD), or a jet vapor deposition. Hence, the second dielectric layer may, for example, be formed by a growth process or by a deposition process.

As noted above, a high-k material may be formed, for example, by a deposition process. Examples of deposition process which may be used include chemical vapor deposition (CVD), physical vapor deposition (PVD), atomic layer deposition (ALD), molecular beam epitaxy (MBE), or other deposition processes.

In one or more embodiments, the second dielectric layer 240 may serve as an inter-gate dielectric layer between a floating gate and a control gate of a floating gate memory device. In one or more embodiments, the floating gate and the control gate may both be formed of a polysilicon material. The polysilicon material may be a doped polysilicon. In this case, the second dielectric layer 240 may serve as interpoly dielectric material.

It is noted that the use of a high-k material as an inter-gate dielectric layer (or as an interpoly dielectric layer) in a floating gate memory device may be beneficial since the larger dielectric constant may lead to larger capacitive coupling. This may lead to a reduction in the power needed to operate the device.

Next, a control gate layer 250 may be formed over the second dielectric layer. The control gate layer 250 may be an upper gate layer.

In one or more embodiments, the control gate layer 250 may comprise, for example, a polysilicon material. The polysilicon material may be polysilicon. The polysilicon may be doped with an n-type dopant (such as phosphorus) or a p-type dopant (such as boron). The doping may be accomplished using an ion implantation process. In one or more embodiments, it is possible that it may also be done in-situ. In one or more embodiments, doping may be at least partially accomplished after the formation of the gate stack as explained below. In one or more embodiments, doping of the control gate layer 250 may be at least partially accomplished during the formation of the extension regions and/or the source/drain regions.

In one or more embodiments, the control gate layer 250 may comprise any conductive material. In one or more embodiments, the control gate layer 250 may comprise a metallic material such as a pure metal or a metal alloy. In one or more embodiments, the control gate layer may be any other material suitable as a control gate for a charge storage memory device. In one or more embodiments, the control gate layer 250 may comprise a metal silicide or a metal nitride. In one or more embodiments, the control gate layer 250 may comprise TiN, TiC, HfN, TaN, TaC, TaN, W, Al, Ru, RuTa, TaSiN, NiSix, CoSix, $TiSi_x$, Ir, Y, Pt, I, PtTi, Pd, Re, Rh, borides, phosphides, or antimonides of Ti, Hf, Zr, TiAlN, Mo, MoN, ZrSiN, ZrN, HfN, HfSiN, WN, Ni, Pr, VN, TiW, other metals, and/or combinations thereof.

The control gate layer 250 may comprise a single layer or a plurality of stacked layers (such as a polysilicon layer disposed over a metal layer). The control gate layer 250 may comprise a mixture (such as a heterogeneous mixture) of two or more different materials. In one or more embodiments, the thickness of the control gate layer 250 may be about 30 nanometer to about 300 nanometer, however, other thicknesses are also possible. The control gate layer 250 may be deposited in many different ways. Examples, include chemical vapor deposition, physical vapor deposition and atomic layer deposition.

In one or more embodiments, the control gate layer 250 may serve as a control gate for a floating gate memory device. In one or more embodiments, the control gate layer may serve as a control gate for a charge trapping memory device.

Next, a masking layer 260 may be formed over the control gate layer 250. In one or more embodiments, the masking layer 260 may comprise a photoresist material.

Figure 2:
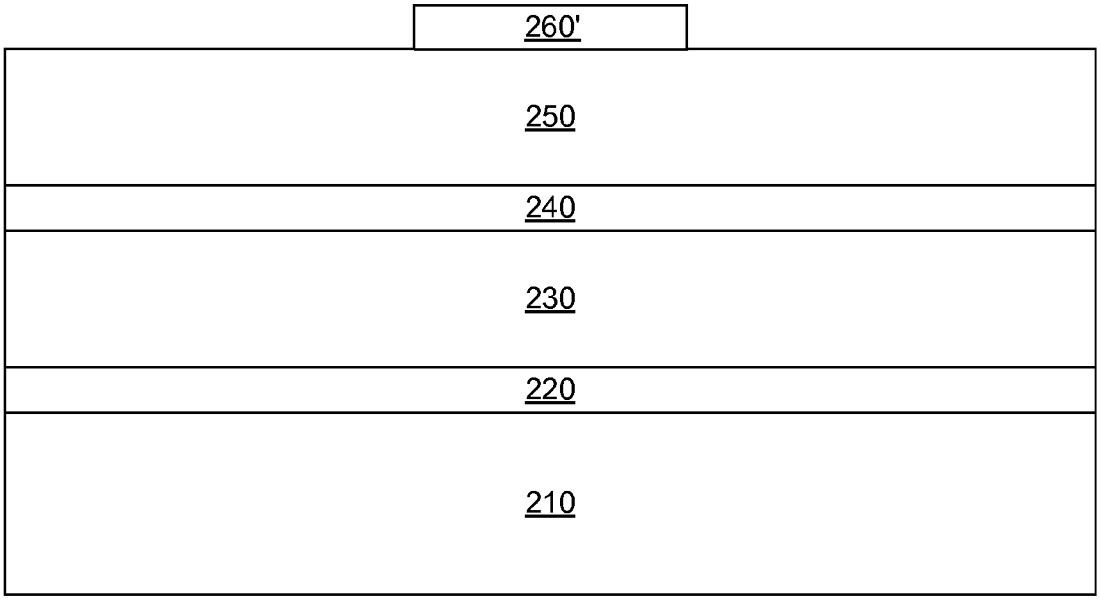

Referring to FIG. 2, the masking layer 260 shown in FIG. 1 may be patterned to form the masking layer 260' as shown in FIG. 2. The masking layer 260' may, of course, function as a mask for an etch process.

Figure 3:
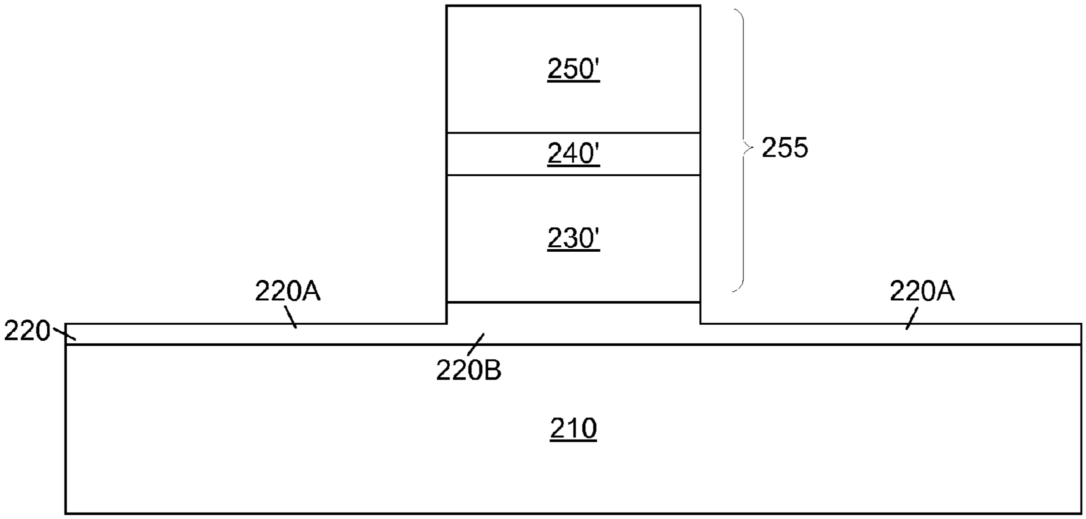

Referring to FIG. 3, using the masking layer 260' shown in FIG. 2, the layers 230, 240 and 250 may be etched to form the gate stack 255 shown in FIG. 3.

The gate stack 255 may comprise a charge storage layer 230' which is a portion of the charge storage layer 230 from FIG. 1. In one or more embodiments, the charge storage layer 230' may be a floating gate layer 230' for a floating gate memory device. A floating gate layer 230' may also be referred to as a floating gate. In one or more embodiments, the charge storage layer 230' may be a charge trapping layer 230' for a charge trapping memory device. The gate stack 255 may comprise a second dielectric layer 240' which is a portion of second dielectric layer 240 from FIG. 1. The gate stack 255 may comprise a control gate layer 250' which is a portion of control gate layer 250 from FIG. 1. The control gate layer 250' may also be referred to as a control gate for the charge storage memory device.

It is noted that the etch process to form the gate stack 255 may take one or two or more etching steps. In one or more embodiments, at least one etch chemistry may be involved. In one or more embodiments, at least two etch chemistries may be involved.

Referring to FIG. 3, in one or more embodiments, the etch process to form the gate stack 255 may stop on or within the first dielectric layer 220. Referring to the embodiment shown in FIG. 3, a portion 220A of the first dielectric layer 220 not underlying the gate stack 255 may be partially etched. In another embodiment, it is possible that the portion 220A is not substantially etched. In another embodiment, it is possible that the portion 220A is etched all the way through. The portion 220B which underlies the gate stack 255 may not be substantially etched. At least a portion 220B of the first dielectric layer 220 underlying the gate stack may serve as a tunneling dielectric for a charge storage device such as a floating gate device or a charge trapping device.

The masking layer 260' may be removed after the formation of the gate stack 255 and is not shown in FIG. 3.

Figure 4:
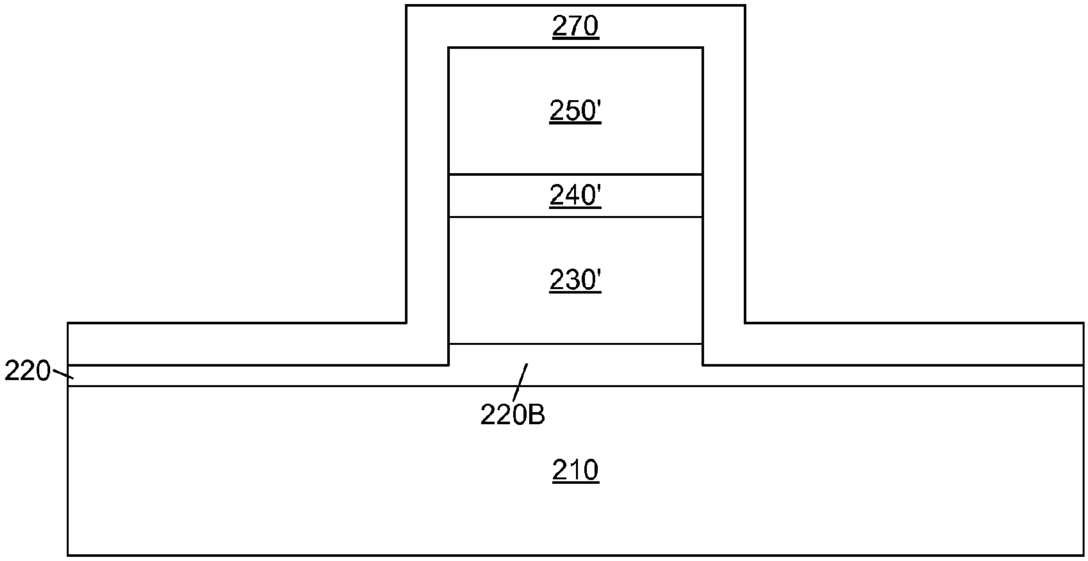

Referring to FIG. 4, in a subsequent processing step, a dielectric layer 270 may be formed over the structure shown in FIG. 3 to form the structure shown in FIG. 4. The dielectric layer 270 may be formed by either a growth process or by a deposition process. The deposition process may be a substantially conformal deposition process. The dielectric layer 270 may be formed on the top and sidewall surface(s) of the gate stack 255 as well as over the exposed portions of the first dielectric layer 220. The dielectric layer 270 may be formed over the sidewall surfaces of the layer 230', the layer 240' and the layer 250'. When a growth process is used, it is possible that the dielectric layer 270 may not substantially grow on the sidewall surfaces of the second dielectric layer 240'.

Generally, the dielectric layer 270 may comprise any dielectric material. In one or more embodiments, the dielectric layer 270 may comprise an oxide (such as silicon dioxide $SiO_2$), a nitride (such as $Si_3N_4$ or $Si_xN_y$) an oxynitride (such as silicon oxynitride, S—O—N or $SiO_xN_y$), or combinations thereof. In one or more embodiments, the dielectric layer 270 may comprise a stack of two or more layers (or a stack of three or more layers) such as an oxide/nitride stack such as a $SiO_2$/

$Si_3N_4$ or an $SiO_2/Si_xN_y$ stack or a nitride/oxide stack, an oxide/nitride/oxide stack (for example, an ONO stack) or combinations thereof. In one or more embodiments, the dielectric layer 270 may comprise a high-k dielectric material.

Figure 5:
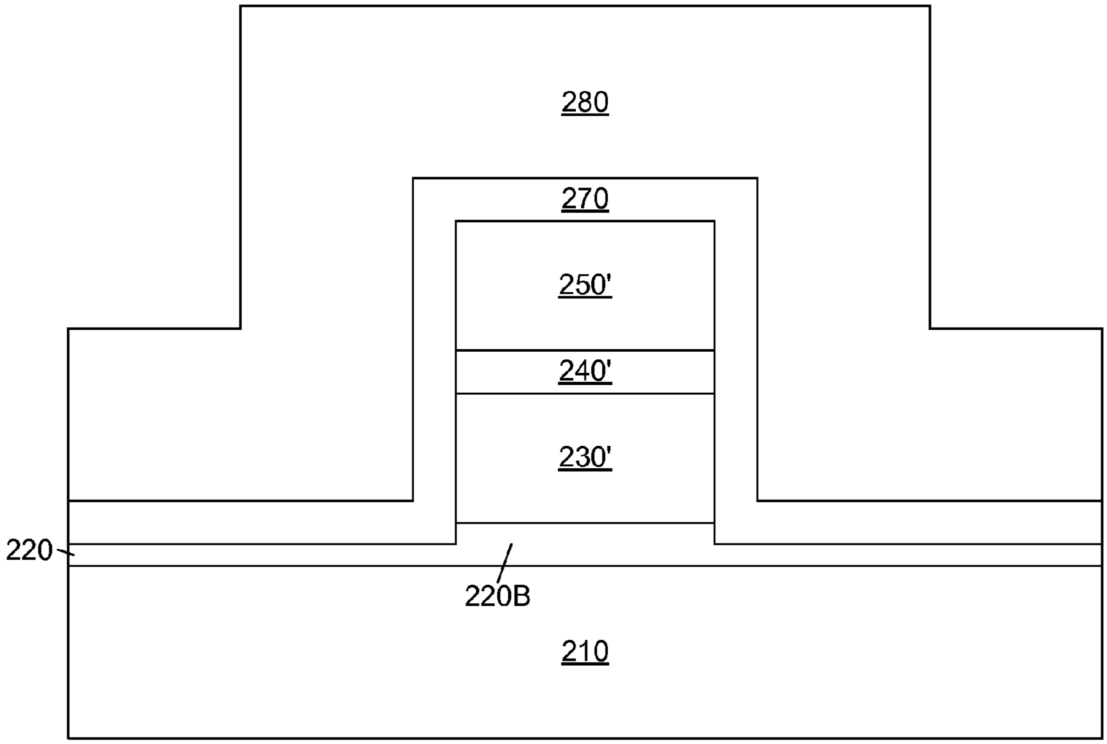

Referring now to FIG. 5, a select gate layer 280 may be formed over the structure shown in FIG. 4 to form the structure shown in FIG. 5. Referring to FIG. 5, it is seen that the select gate layer 280 may be formed over the dielectric layer 270. The select gate layer 280 may be formed by a deposition process or a growth process. The deposition process may be a substantially conformal deposition process.

In one or more embodiments, the select gate layer 280 may comprise, for example, a polysilicon material. The polysilicon material may be polysilicon. The polysilicon material may be a doped polysilicon. The polysilicon may be doped with an n-type dopant (such as phosphorus) or a p-type dopant (such as boron). The doping may be accomplished using an ion implantation process or be done in-situ. In one or more embodiments, doping may be at least partially accomplished during the formation of the extension regions and/or the source/drain regions. The formation of the extension regions and the source/drain regions is explained below.

In one or more embodiments, the select gate layer 280 may comprise any conductive material. In one or more embodiments, the select gate layer 280 may comprise a metallic material such as a pure metal or a metal alloy. In one or more embodiments, the select gate layer 280 may be any other material suitable as a select gate for a charge storage memory device. In one or more embodiments, the select gate layer 280 may comprise a metal silicide or a metal nitride. In one or more embodiments, the select gate layer 280 may comprise TiN, TiC, HfN, TaN, TaC, TaN, W, Al, Ru, RuTa, TaSiN, NiSix, CoSix, $TiSi_x$, Ir, Y, Pt, I, PtTi, Pd, Re, Rh, borides, phosphides, or antimonides of Ti, Hf, Zr, TiAlN, Mo, MoN, ZrSiN, ZrN, HfN, HfSiN, WN, Ni, Pr, VN, TiW, other metals, and/or combinations thereof. In one or more embodiments, the select gate layer 280 may comprise a semiconductor material. In one or more embodiments, the select gate layer 280 may comprise a dielectric material.

In one or more embodiments, the select gate layer 280 may have a thickness of about 100 nm or greater. In one or more embodiments, the select gate layer 280 may have a thickness of about 150 nm or greater. In one or more embodiments, the select gate layer 280 may have a thickness of about 200 nm or greater. In one or more embodiments, the select gate layer 280 may have a thickness between about 100 nm and about 300 nm.

Figure 6:
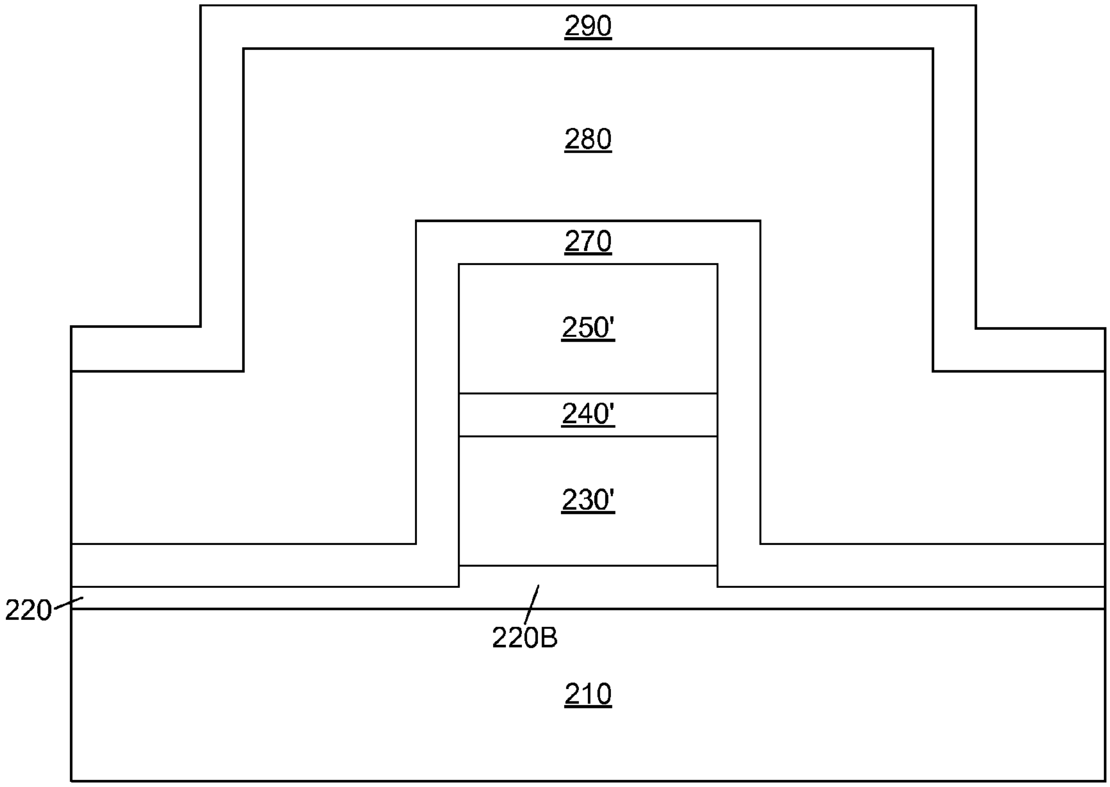

Referring to FIG. 6, an additional layer 290 is formed over the select gate layer 280. Generally, the additional layer 290 may be formed by a growth process or by a deposition process. In one or more embodiments, the additional layer 290 may be formed by a substantially conformal deposition process.

In one or more embodiments, the additional layer 290 may comprise a carbon material. Generally, the carbon material may be any material that comprises carbon (C). In one or more embodiments, the carbon material may comprise one or more carbon atoms. In one or more embodiments, the carbon material may comprise molecular carbon. In one or more embodiments, the carbon material may comprise a carbon compound. In one or more embodiments, the carbon material may comprise an allotrope of carbon. An allotrope of carbon may also be referred to as a carbon allotrope. Examples of carbon allotropes include, but are not limited to, diamond, graphite, amorphous carbon, and fullerenes (e.g. buckminsterfullerenes). Examples of fullerenes include, but are not limited to, buckyballs, carbon nanotubes and nanobuds. Further examples of carbon allotropes include, but are not limited to, aggregated diamond nanorods (or ADNRs), glassy carbon, carbon nanoform, lonsdaleite and linear acetylenic carbon (or LAC). In one or more embodiments, the additional layer 290 may comprise a conductive allotrope of carbon (also referred to as a conductive carbon allotrope).

In one or more embodiments, the carbon material may include, without limitation, diamond, graphite, graphene, amorphous carbon, silicon carbide and fullerenes (e.g. buckminsterfullerenes). Examples of fullerenes include, but are not limited to, buckyballs, carbon nanotubes and nanobuds. Further examples of possible carbon materials include aggregated diamond nanorods (or ADNRs), glassy carbon, carbon nanoform, lonsdaleite and linear acetylenic carbon (or LAC). In one or more embodiments, the additional layer 290 may include two or more different carbon materials.

In one or more embodiments, the additional layer 290 may comprise amorphous carbon. In one or more embodiments, the amorphous carbon may be in a substantially pure or undoped form. In one or more embodiments, the amorphous carbon may be doped. For example, in one or more embodiments, the amorphous carbon may, for example, be doped with nitrogen.

In one or more embodiments, the additional layer 290 may comprise silicon carbide.

In one or more embodiments, the additional layer 290 may comprise at least material selected from the group consisting of amorphous carbon and silicon carbide.

In one or more embodiments, the additional layer 290 may comprise carbon (C) and silicon (Si). In one or more embodiments, the additional layer 290 may consist essentially of carbon (C) and silicon (Si). In one or more embodiments, the additional layer 290 may comprise carbon (C). In one or more embodiments, the additional layer 290 may consist essentially of carbon (C).

When the additional layer 290 comprises carbon (which may, for example, be in the form of amorphous carbon, graphite, graphene, silicon carbide or some other carbon derivative, it is possible that the carbon may be deposited by a chemical vapor deposition process. As an example, this may be a $C_xH_y$ based CVD process (such as a PECVD or a LPCVD process or a sputtering process).

In one or more embodiments, the additional layer 290 may have a thickness of about 100 nm or less. In one or more embodiments, the layer 290 may have a thickness of about 50 nm or less. In one or more embodiments, the layer 290 may have a thickness of about 10 nm or more. In one or more embodiments, the layer 290 may have a thickness of about 20 nm or more. In one or more embodiments, the layer 290 may have a thickness between about 15 nm and about 60 nm. In one or more embodiments, the layer 290 may have a thickness between about 20 nm and about 50 nm.

In one or more embodiments, the additional layer 290 may comprise a dielectric material. Generally, any dielectric material may be used. In one or more embodiments, the dielectric material may comprise an oxide (such as silicon oxide). In another embodiment, the dielectric material may comprise a nitride (such as silicon nitride). In another embodiment, the dielectric material may comprise an oxynitride (such as silicon oxynitride).

In one or more embodiments, the additional layer 290 may be different from the select gate layer 280. In one or more embodiments, the additional layer 290 may comprise a material which is different from that of the select gate layer 280.

Figure 7:
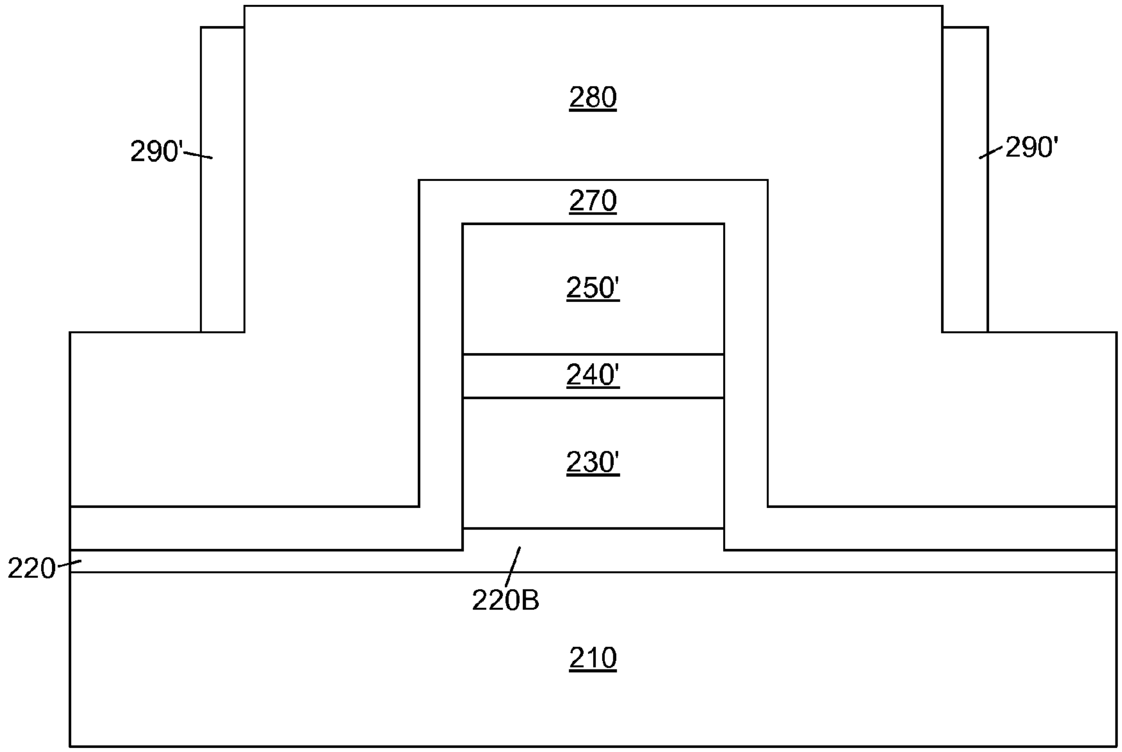

Referring to FIG. 7, the additional layer 290 shown in FIG. 6 may be etched to remove one or more portions of the additional layer 290. The additional layer 290 may be etched so as to remove one or more portions of the additional layer 290 that are horizontally disposed. In one or more embodiments, the etch may be stopped with end-point detection to materials in the select gate layer 280. For example, the etch chemistry for materials in the additional layer 290 may be different from the etch chemistry for materials in the select gate layer 280. For example, the materials in the additional layer 290 may be said to be highly selective to the materials in the select gate layer 280.

In one or more embodiments, the additional layer 290 may be etched using an anisotropic etch. In one or more embodiments, the anisotropic etch may be a dry etch. In or more embodiments, the additional layer 290 may be etched using a dry etch. The dry etch may be a plasma etch. The dry etch may be a reactive ion etch (RIE). The etch may include a reactive chemical process and/or a physical process using ion bombardment. In one or more embodiments, the select gate layer 280 may be used for end-point detection.

The remaining portions of the additional layer 290 shown in FIG. 6, may form the sidewall spacers 290' shown in FIG. 7.

Figure 8:
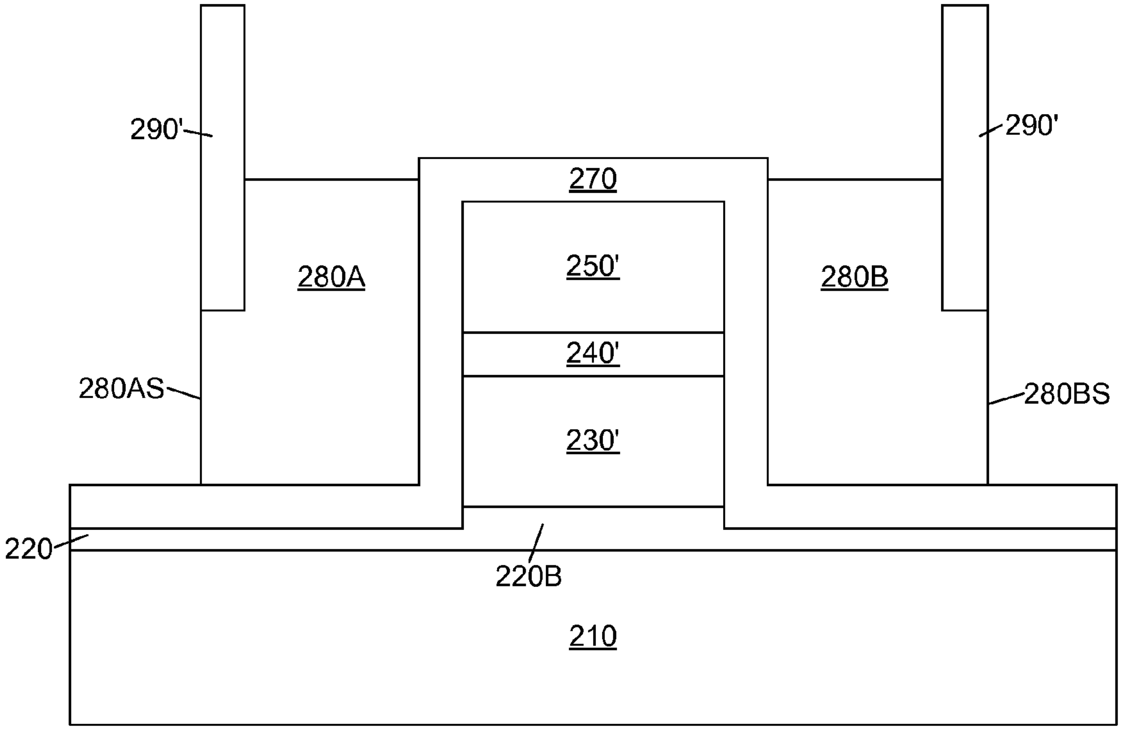

Referring to FIG. 8, the select gate layer 280 shown in FIG. 7 may then be etched to form the structure shown in FIG. 8. A different etch chemistry may be used. The select gate layer 280 may be etched using an anisotropic etch. The etch may be a dry etch such as a dry plasma etch. The dry etch may be a plasma etch. The dry etch may be a reactive ion etch (RIE). The etch may include a reactive chemical process and/or a physical process using ion bombardment. The etch chemistry used may be one which can more easily etch the select gate layer 280 and less easily etch the sidewall spacers 290'. The etch may be selective to the select gate layer 280 relative to sidewall spacers 290'. Hence, in one or more embodiments, the sidewall spacers 290' may thus serve as masks when etching the select gate layer 280. In one or more embodiments, the select gate layer 280 may comprise polysilicon while the sidewall spacers 290' may comprise a carbon material. Examples of carbon materials are provided above and include, without limitation, materials such as amorphous carbon, graphite, graphene and silicon carbide.

As a result of the etch two select gate layers 280A,B are formed on either side of the gate stack 255 as shown in FIG. 8. Each of the select gate layers 280A,B may be adjacent to layer 270 and laterally disposed from a sidewall of the gate structure 255. In one or more embodiments, each of the select gate layers 280A,B may be substantially block shaped. In one or more embodiments, each of the select gate layers 280A,B may have a substantially rectangular vertical cross section. In one or more embodiments, each of the select gate layers 280A,B may be in the form of a sidewall spacer.

Each of the select gate layers 280A,B may also be referred to as a select gate 280A,B.

As a result of the presence of the sidewall spacers 290' the outer sidewall surfaces 280AS and 280BS of the select gates 280A,B may be protected during the etching of the select gate layer 280. Hence, in one or more embodiments, the outer sidewall surfaces 280AS, 280BS may be substantially vertically disposed.

While not wishing to be bound by theory, the shape of the select gates 280A,B, may play a role in determining the electrical characteristics of the select gates. If the select gates are quasi-triangular in shape it is possible that the outer edge of the underlying dielectric (for example, oxide) and substrate are not protected with respect to the extension and source/drain implants. This may give rise to reliability issues. It may thus be useful that the outer sidewall surface of the select gate (e.g. the sidewall surface remote to the gate stack), may comprise some vertical component in order for the select gates to protect the underlying dielectric (for example, oxide) and substrate from the effects of unintentional implantation. Such a vertical component may additionally allow formation of an implant protecting spacer (for example, a dielectric spacer) later in the process.

Figure 9:
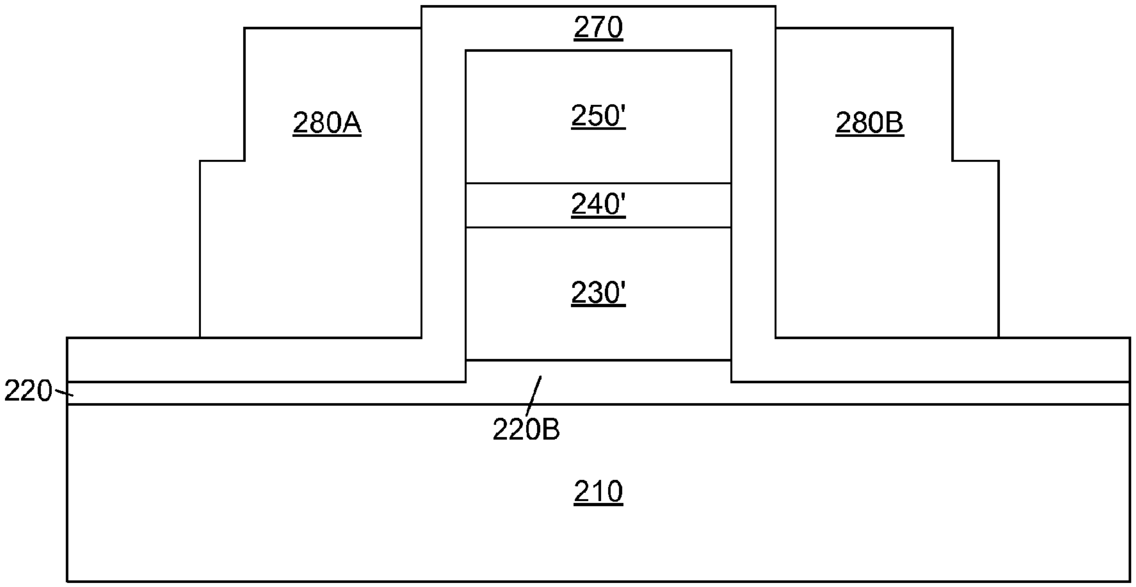

Referring to FIG. 9, the sidewall spacers 290' may then be removed. The removal may be accomplished using an etching process. The etching process may comprise a wet etching process. The etching process may comprise an oxygen-based reactive ion etch or other high-polymerizing etch chemistries.

Figure 10:
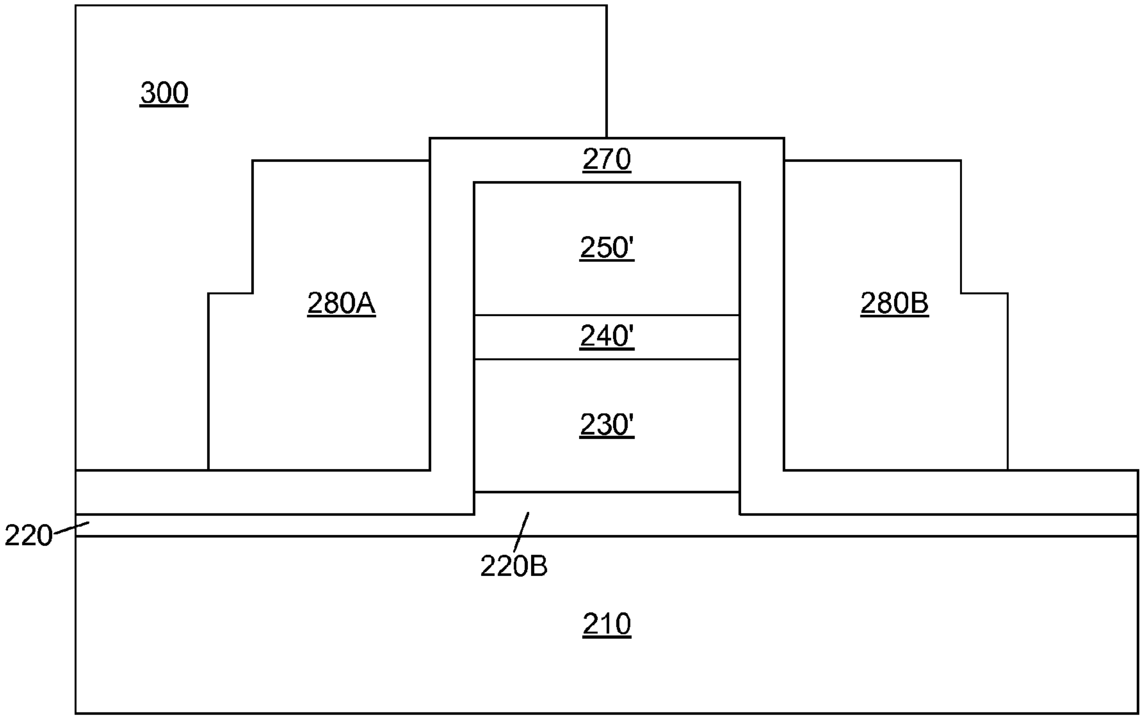

Referring to FIG. 10, a masking layer 300 is then formed over the structure shown in FIG. 9 to form the structure shown in FIG. 9. The masking layer 300 may be formed over only one of the two select gate structures 280A,B and, optionally, over at least a portion of layer 270 and, optionally, over at least a portion of the gate stack 255. The masking layer 300 is formed so that one of the select gates (for example, select gate 280A) is covered by the masking layer 300 while the other select gate (for example, select gate 280B) remains uncovered by the masking layer 300. The masking layer 300 may comprise a photoresist material.

Figure 11:
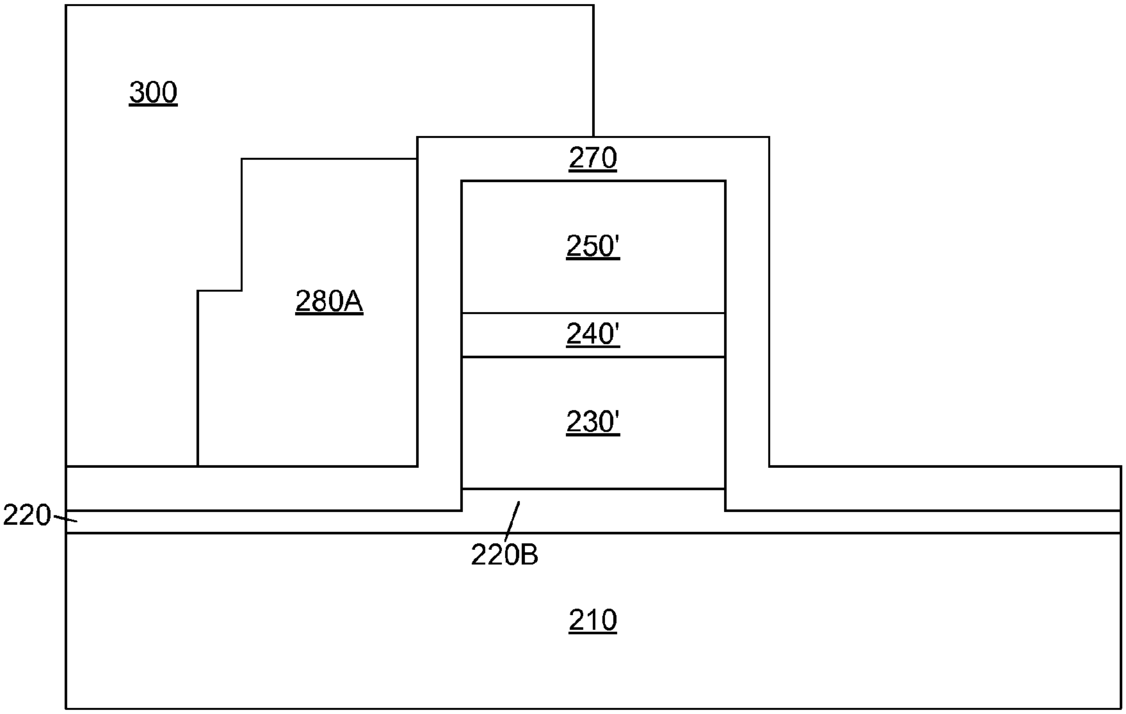

Referring to FIG. 11, after the formation of the masking layer 300, the select gate 280B may be removed. The removal may be accomplished by an etch process. The etch process may comprise a dry etch process. The dry etch process may be a plasma etch process. The dry etch process may comprise a reactive ion etch. The etch process may be an anisotropic etch. The select gate 280A is not etched and remains.

After the formation of the structure shown in FIG. 11, at least two possible method embodiments are possible. The first embodiment is described by the FIGS. 12A, 13A, 14A, 15A and 16A. A second embodiment is described by the FIGS. 12B, 13B, 14B, 15B and 16B.

Figure 12A:
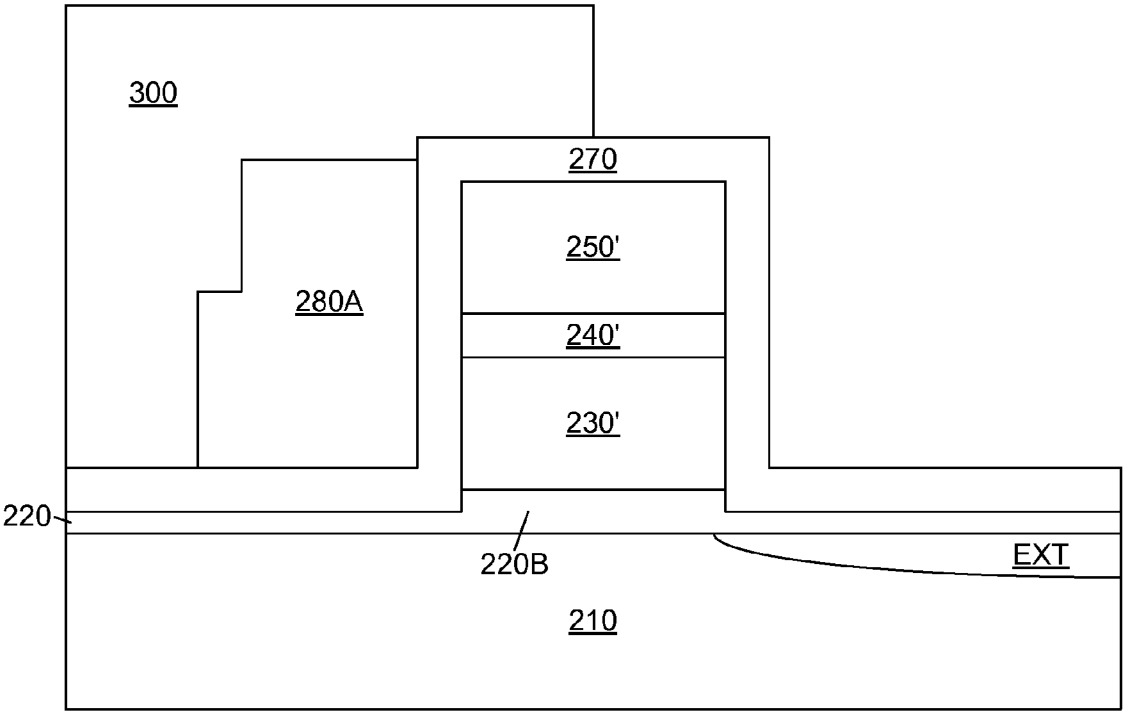

The first embodiment as shown in FIGS. 12A, 13A, 14A, 15A and 16A will now be discussed. The structure shown in FIG. 11 may be subject to an ion implantation process to form extension region EXT as shown in FIG. 12A. Referring to FIG. 12A, in one or more embodiments, the extension region EXT may, for example, be lightly doped drain (LDD) regions. In one or more embodiments, the extension region EXT may, for example, be medium doped drain (MDD) regions. It is noted that in FIG. 12A, an extension region EXT is formed only to one side of the gate stack 255. In one or more embodiments, the extension region EXT may be n-type. In one or more embodiments, the extension region EXT may be p-type.

Figure 13B:
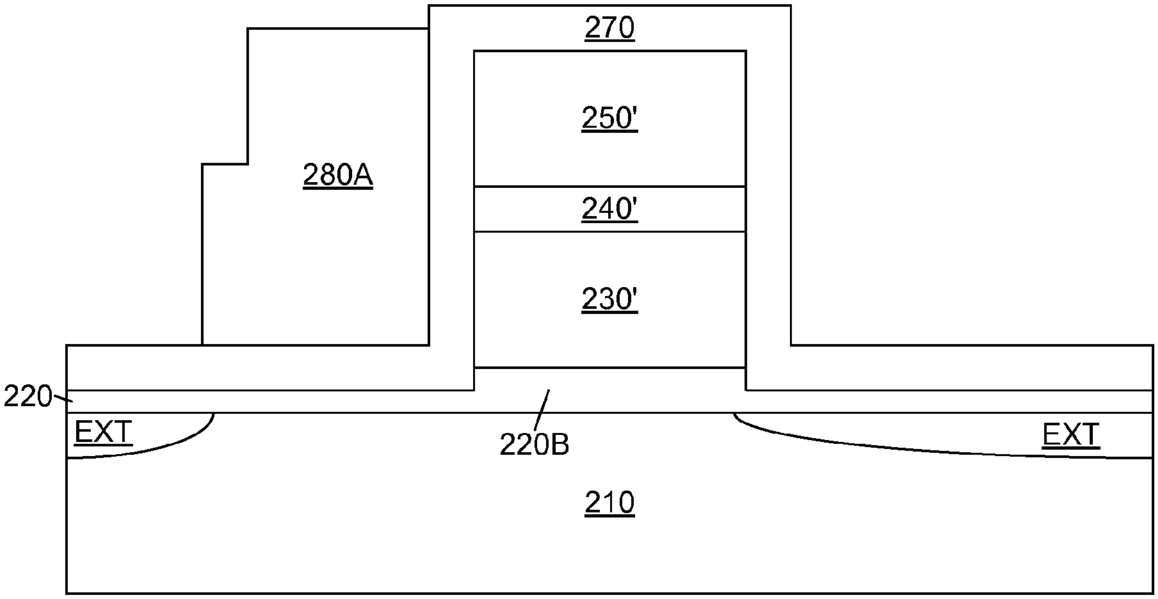
Figure 13A:
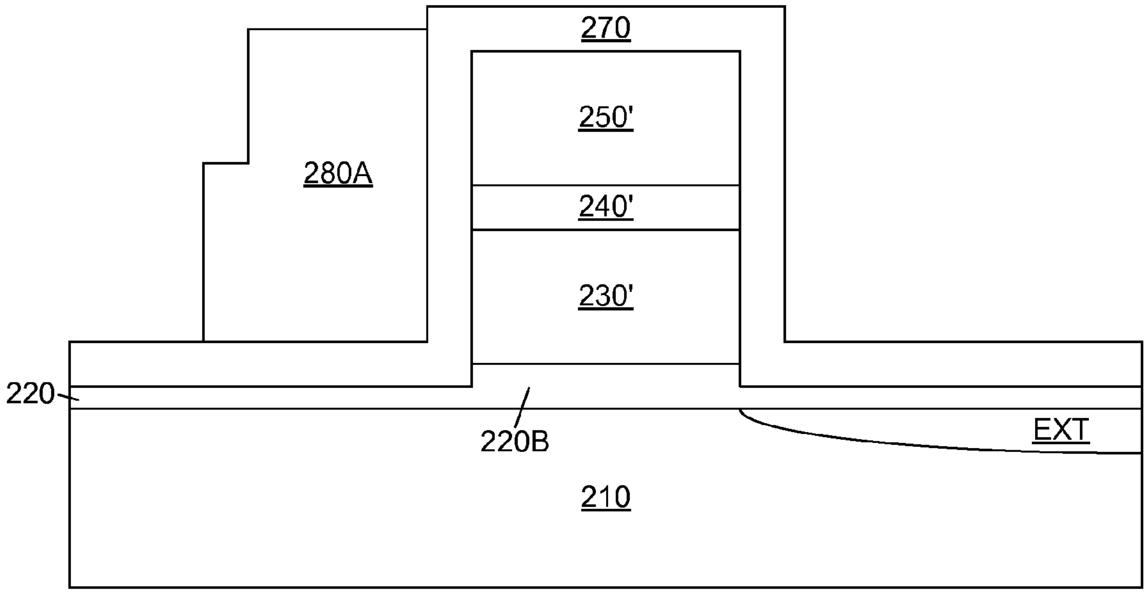

Referring to FIG. 13A, after the formation of the extension region EXT, the masking layer 300 may be removed. The removal may be accomplished by an etching process.

Figure 14A:
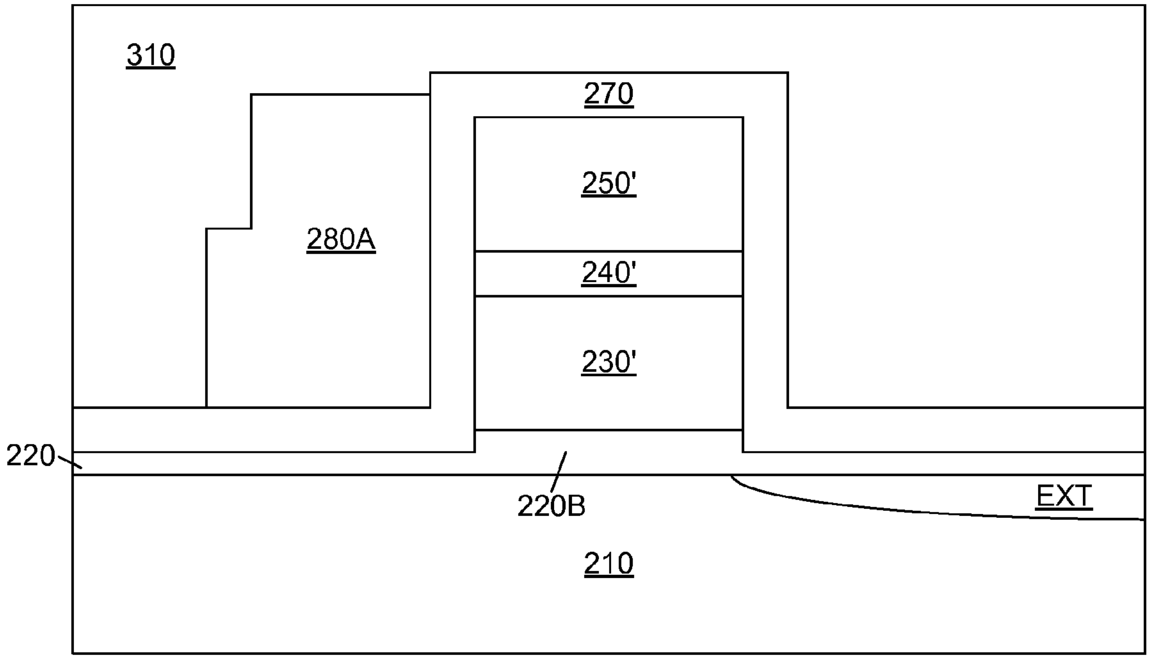

Referring to FIG. 14A, a dielectric layer 310 may then formed over the structure shown in FIG. 13A to form the structure shown in FIG. 14A. The dielectric layer 310 may be formed over the select gate 280A as well as over the dielectric layer 270 and over the gate structure 255. The dielectric layer 310 may be formed by either a deposition process or a growth process. The deposition process may comprise a substantially conformal deposition process. The dielectric layer 310 may be formed of any dielectric material. Examples of dielectric materials include, but not limited to, oxides, nitrides, oxynitrides and mixtures thereof. The dielectric material may comprise a high-k material. In one or more embodiments, the dielectric layer 310 may be different from the dielectric layer 270. In one embodiment, the dielectric layer 270 and the dielectric layer 310 may comprise a different dielectric material. In one embodiment, it is possible that the dielectric layer 270 may comprise an oxide while the dielectric layer 310 may comprise a nitride. In another embodiment, it is possible that the dielectric layer 270 comprise a nitride while the dielectric layer 310 comprise an oxide. In yet another embodiment, the dielectric layer 270 and the dielectric layer 310 may comprise the same dielectric material.

Figure 15B:
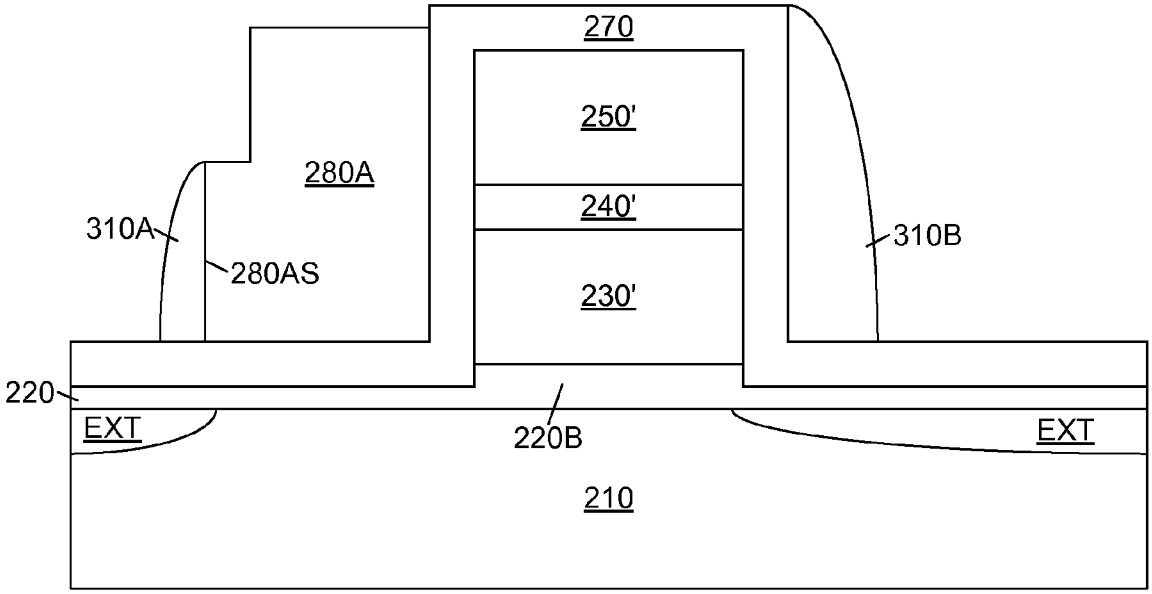
Figure 15A:
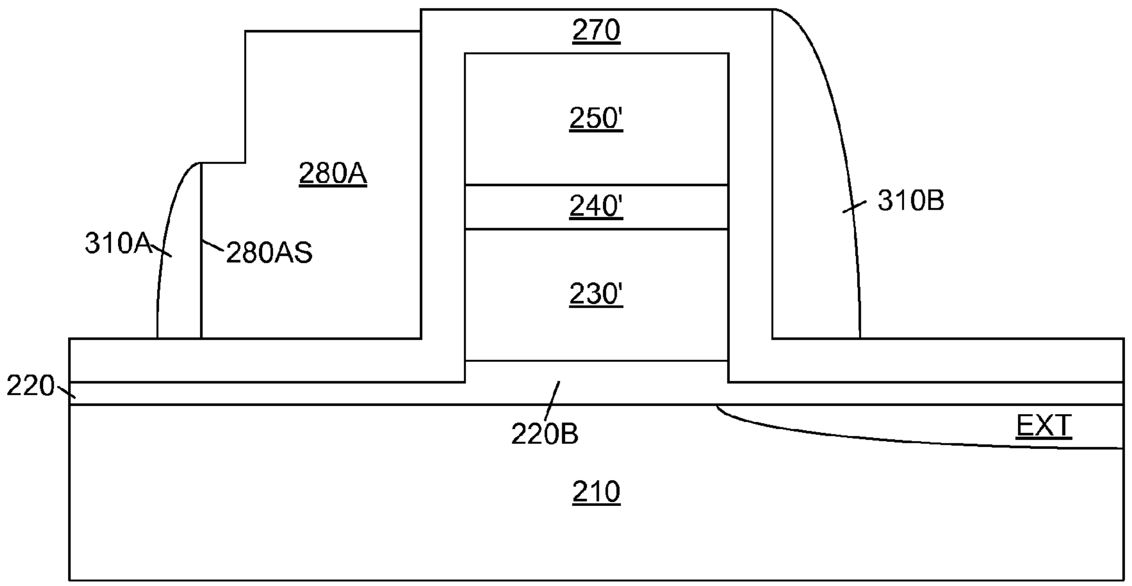

Referring to FIG. 15A, the dielectric layer 310 shown in FIG. 14A may then be etched to form the structure shown in FIG. 15A. The etching process may be a dry etch. The etching process may be an anisotropic etch. The etching process comprise be a dry etch process. The dry etch process may comprise a plasma etch. The dry etch process may comprise a reactive ion etch (RIE).

As a result of the etch, sidewall spacers 310A and 310B may then be formed. The sidewall spacer 310A may be disposed over the sidewall 280AS of select gate 280A. Sidewall spacer 310A may be disposed adjacent to and lateral to a sidewall 280AS of the select gate 280A. The sidewall spacer 310B may overlie that portion of dielectric layer 270 that overlies a sidewall of the gate stack 255. The sidewall spacer 310B may be disposed adjacent to and lateral to a sidewall of the dielectric layer 270. The sidewall spacer 310A may be proximate to the select gate 280A and remote to the gate stack 255. The sidewall spacer 310B may be proximate to the gate stack 255 and remote to the select gate 280A.

Figure 16A:
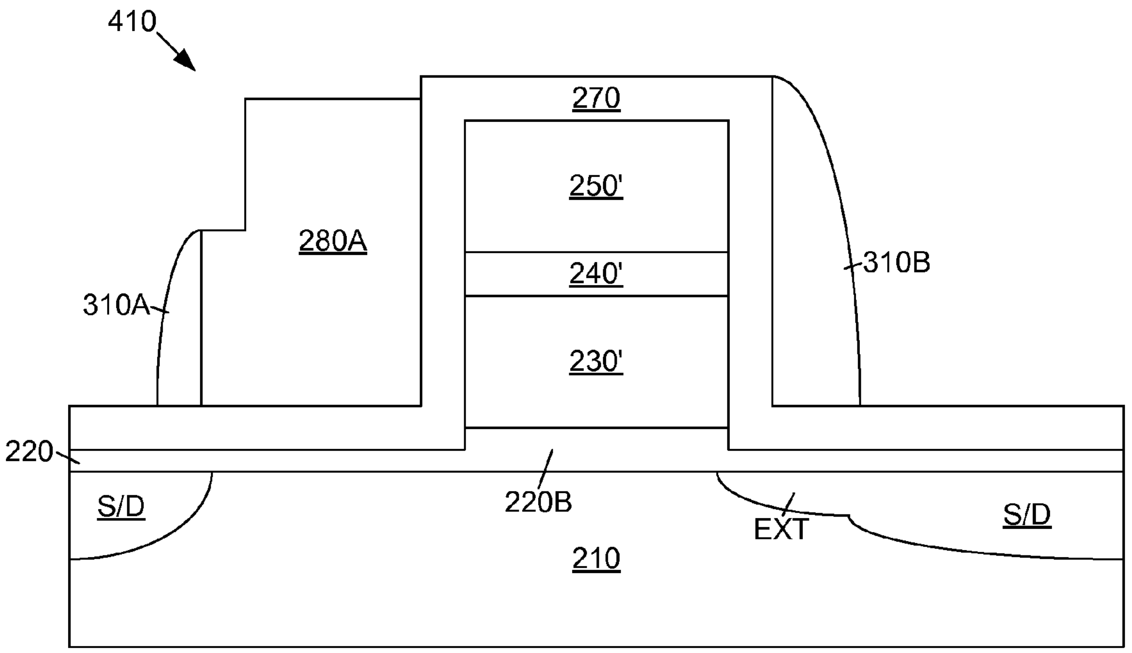

After the formation of the sidewall spacers 310A and 310B, the structure shown in FIG. 15A may be ion implanted to form the source/drain regions S/D that are shown in FIG. 16A. In one or more embodiments, the source/drain regions S/D may be formed as heavily doped drain (HDD) regions. The dopant type of the source/drain regions S/D may be the same as the dopant type of the extension regions EXT. The dopant concentration of the source/drain regions S/D may be greater than the dopant concentration of the extension region EXT. The depth of the source/drain regions S/D may be greater than the depth of the extension region EXT.

In one or more embodiments, the ion implantation step used to form the extension region EXT may also serve to dope the control gate layer 250' and/or the select gate 280A with either n-type or p-type dopants. Likewise, in one or more embodiments, the ion implantation step used to form the source/drain regions S/D may be used to dope the control gate layer 250' and/or the select gate 280A with n-type or p-type dopants.

The second embodiment as shown in FIGS. 12B, 13B, 14B, 15B and 16B will now be described. Referring again to the structure shown in FIG. 11, the masking layer 300 may be removed to form the structure shown in FIG. 12B.

Figure 12B:
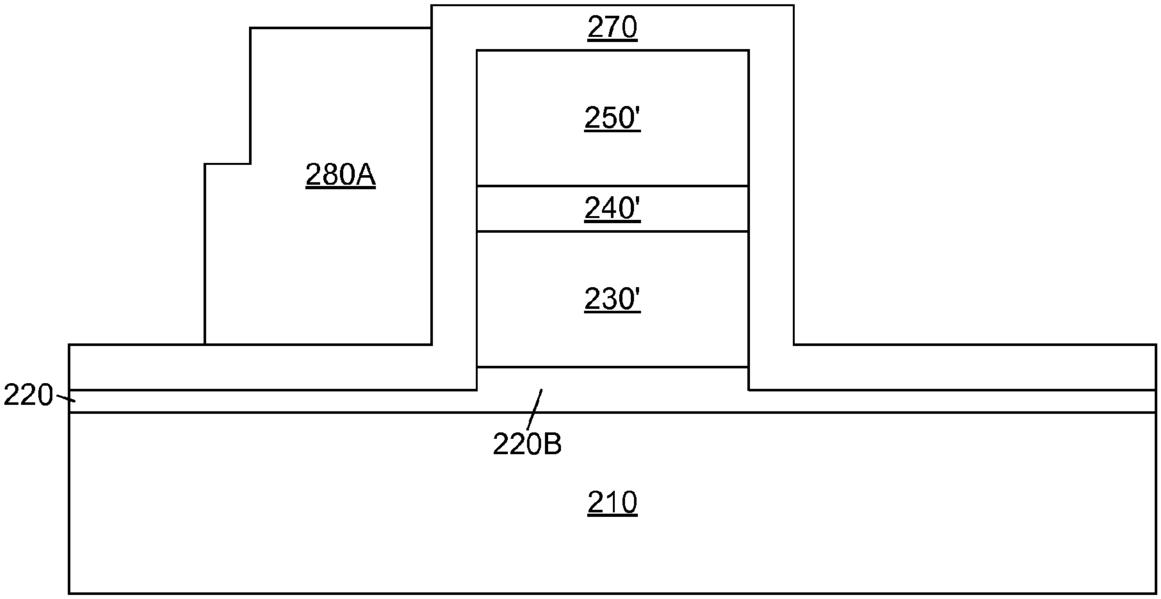

The structure shown in FIG. 12B may be subject to an ion implantation process to form extension regions EXT as shown in FIG. 13B. In one or more embodiments, the extension regions EXT may, for example, be lightly doped drain (LDD) regions. In one or more embodiments, the extension regions EXT may, for example, medium doped drain (MDD) regions. It is noted that in FIG. 13B, extension regions EXT may be formed lateral to both sides of the gate stack 255. In one or more embodiments, the extension regions EXT may be n-type. In one or more embodiments, the extension regions EXT may be p-type.

Figure 14B:
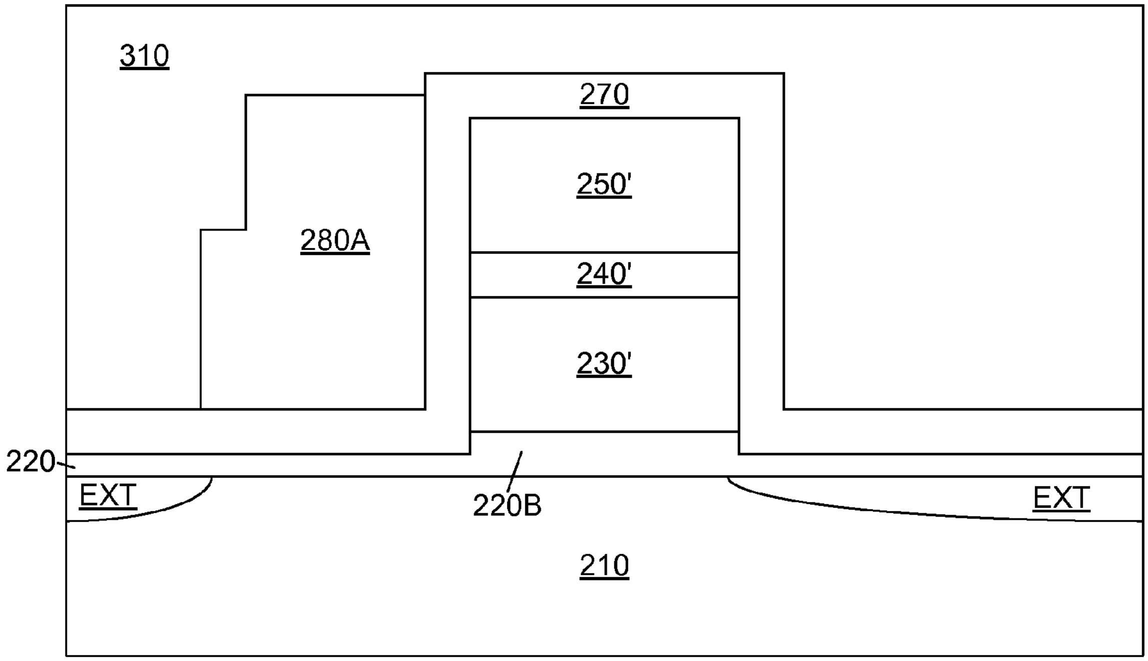

Referring to FIG. 14B, a dielectric layer 310 may then be formed over the structure shown in FIG. 13B to form the structure shown in FIG. 14B. The dielectric layer 310 may be formed over the select gate 280A as well as over the dielectric layer 270 and over the gate structure 255. The dielectric layer 310 may be formed by either a deposition process or a growth process. The deposition process may comprise a substantially conformal deposition process. The dielectric layer 310 may be formed of any dielectric material. Examples of dielectric materials include, but not limited to, oxides, nitrides, oxynitrides and mixtures thereof. The dielectric material may comprise a high-k material. In one or more embodiments, the dielectric layer 310 may be different from the dielectric layer 270. In one embodiment, the dielectric layer 270 and the dielectric layer 310 may comprise different dielectric material. In one embodiment, it is possible that the dielectric layer 270 may comprise an oxide while the dielectric layer 310 may comprise a nitride. In another embodiment, it is possible that the dielectric layer 270 comprise a nitride while the dielectric layer 310 comprise an oxide. In yet another embodiment, the dielectric layer 270 and the dielectric layer 310 may comprise the same dielectric material.

Referring to FIG. 15B, the dielectric layer 310 shown in FIG. 14B may then be etched to form the structure shown in FIG. 15B. The etching process may be a dry etch. The dry etch may be a plasma etch. The dry etch may be a reactive ion etch (RIE). The etching process may be an anisotropic etch. The anisotropic etch may be a dry etch such as a plasma etch or a reactive ion etch (RIE). As a result of the etch, sidewall spacers 310A and 310B may then be formed. The sidewall spacer 310A may overlie the sidewall 280AS of the sidewall spacer 280A. Sidewall spacer 310A may be disposed adjacent to and lateral to a sidewall of the select gate 280A. The sidewall spacer 310B may overlie that portion of the dielectric layer 270 that overlies a sidewall of the gate stack 255. The sidewall spacer 280B may be disposed adjacent to and lateral to a sidewall of the dielectric layer 270. The sidewall spacer 310A may be proximate to the select gate 380A and remote to the gate stack 255. The sidewall spacer 310B may be proximate to the gate stack 255 and remote to the select gate 280A.

Figure 16B:
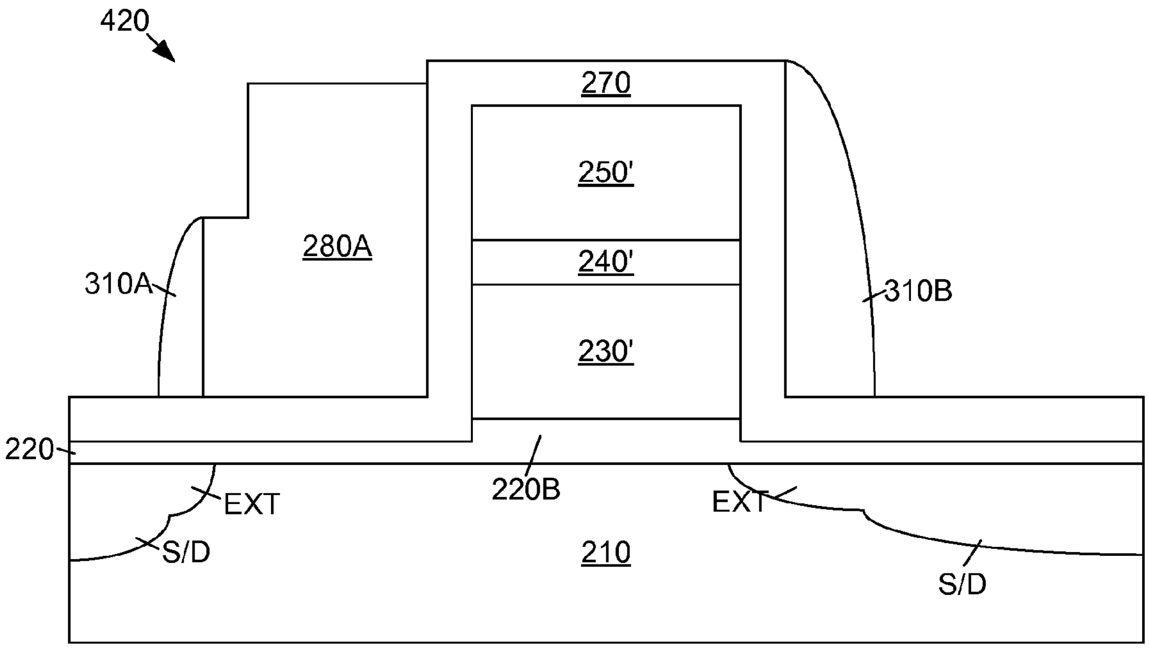

Referring to FIG. 16B, after the formation of the sidewall spacers 310A and 310B, the structure shown in FIG. 15B may be ion implanted to form the source/drain regions S/D as shown in FIG. 16B. In one or more embodiments, the source/drain regions S/D may be formed as heavily doped drain (HDD) regions. The dopant type of the source/drain regions S/D may be the same as the dopant type of the extension regions EXT. The dopant concentration of the source/drain regions EXT may be greater than the dopant concentration of the extension regions EXT. The depth of the source/drain regions S/D may be greater than the depth of the extension region EXT.

In one or more embodiments, the ion implantation step used to form the extension regions EXT may also serve to dope the control gate layer 250' and/or the select gate structure 280A with either n-type or p-type dopants. Likewise, in one or more embodiments, the ion implantation step used to form the source/drain regions S/D may be used to dope the control gate layer 250' and/or the select gate structure 280A with n-type or p-type dopants.

The semiconductor device 410 shown in FIG. 16A as well as the semiconductor device 420 shown in FIG. 16B includes a charge storage layer 230', a control gate 250' and a select gate 280A.

In one or more embodiments, the semiconductor device 410 shown in FIG. 16A or the semiconductor device 420 shown in FIG. 16B may be useful as memory devices such as a charge storage memory device. The memory device 410 shown in FIG. 16A and the memory device 420 shown in FIG. 16B each include a charge storage layer 230', a control gate 250' and a select gate 280A.

In one or more embodiments, the charge storage memory devices 410, 420 may be floating gate memory devices. In this case, the charge storage layer 230' may be a floating gate layer. The floating gate layer may also be referred to as a floating gate for the floating gate memory device. In one or more embodiments, the control gate 250', the floating gate 230' and the select gate 280A may, for example, each be formed of a doped polysilicon. In one or more embodiments, the control gate 250', the floating gate 230' and the select gate 280A may be formed of any conductive material. The first dielectric layer 220 may, for example, be formed of an oxide, such as silicon dioxide (which may be formed by a growth process). The second dielectric layer 240' may, for example, be formed of an oxide material or of a high-k material. In another embodiment, the second dielectric layer 240' may be formed of an oxide-nitride-oxide stack. Of course, the materials mentioned are only examples and other materials may be substituted for the materials described.

In one or more embodiments, the charge storage devices 410, 420 may be floating gate devices. In one or more embodiments, a floating gate device may possibly be programmed by Fowler-Nordheim tunneling or by hot-carrier injection. In one or more embodiments, erasure may possibly be accomplished by UV emission or by Fowler-Nordheim tunneling. In one or more embodiments, it is possible that electrical charge may be stored on the floating gate so as to adjust the threshold voltage $V_T$ of the device. Of course, these are only examples of possible ways to operate a floating gate device and other ways may also be possible.

In one or more embodiments, the charge storage memory devices 410, 420 may be charge trapping memory device. In this case, the charge storage layer 230' may be a charge trapping layer. The charge trapping layer may, for example, comprise a nitride (such as silicon nitride), an oxynitride, a nanocrystalline material or a high-k material. In one or more embodiments, the charge storage layer may comprise a dielectric material. The first dielectric layer 220 may, for example, be an oxide (such as a silicon dioxide). The oxide may, for example, be formed by a growth process. The second dielectric layer 240' may, for example, be an oxide or, possibly, a high-k material. The control gate layer 250' may, for example, be a polysilicon material such as a doped polysilicon. The select gate 280A may, or example, be a polysilicon material such as a doped polysilicon. Of course, the materials described are only example and other materials may be substituted for the materials described.

In one or more embodiments, the semiconductor devices 410, 420 may be charge trapping devices. In one or more embodiments, a charge trapping device may possibly be programmed by applying a sufficiently high positive voltage to the control gate 250'. This may lead to an electron tunneling current (for example, by Fowler-Nordheim tunneling) from the substrate 210 through the first dielectric layer 220 and toward the charge trapping layer 230', where the electrons may be trapped. The trapped electrons may give rise to an increased threshold voltage $V_T$ which may indicate that the device is programmed. In one or more embodiments, a charge trapping device may possibly be erased by applying a suitable negative voltage to the control gate. In one or more embodiments, as another example, a charge trapping device may possibly be programmed by hot-carrier injection. Of course, these are only examples of possible ways to possibly operate a charge trapping device and other ways may also be possible.

The charge storage memory device 410 shown in FIG. 16A as well as the charge storage memory device 420 shown in FIG. 16B may be part of a semiconductor chip. The semiconductor chip may include an integrated circuit and the charge storage devices 410, 420 may be part of the integrated circuit.

In one or more embodiments, the charge storage memory device 410 shown in FIG. 16A or the charge storage memory device 420 shown in FIG. 16B may be stand-alone memory devices. In one or more embodiments, the charge storage memory device 410 shown in FIG. 16A or the charge storage memory device 420 shown in FIG. 16B, may be used as an embedded memory device in combination with at least one logic device on the same chip or the same substrate. Hence, the same chip (or same substrate) may include a memory portion (with one or more memory devices) and a logic portion (with one or more logic devices).

Figure 17:
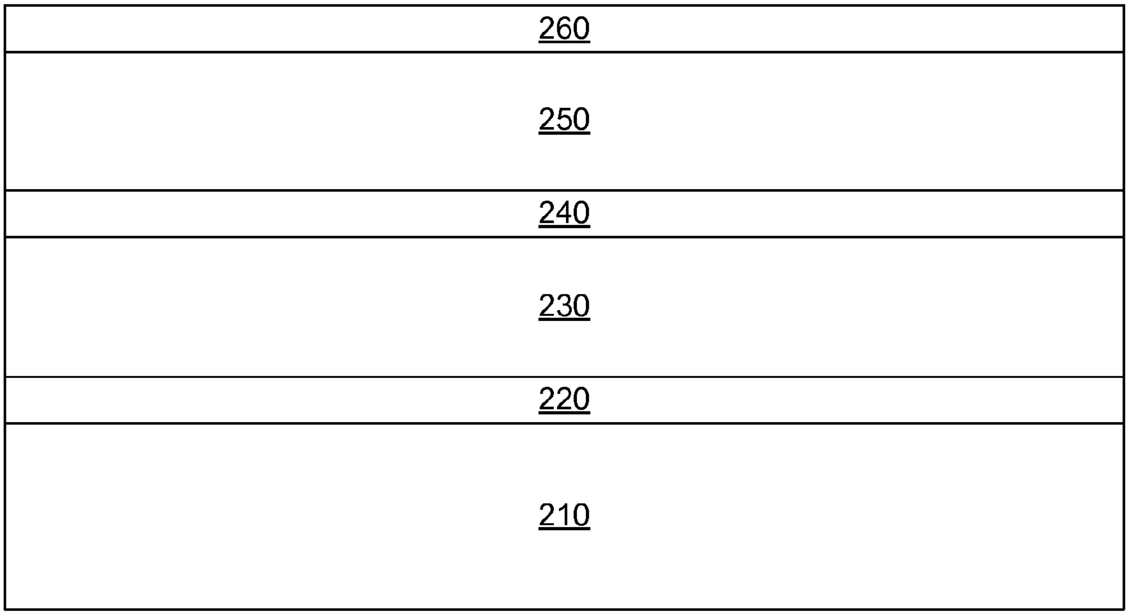
FIGS. 17 through 27A,B show methods for making semiconductor devices in accordance with embodiments of the present invention.
Figure 18:
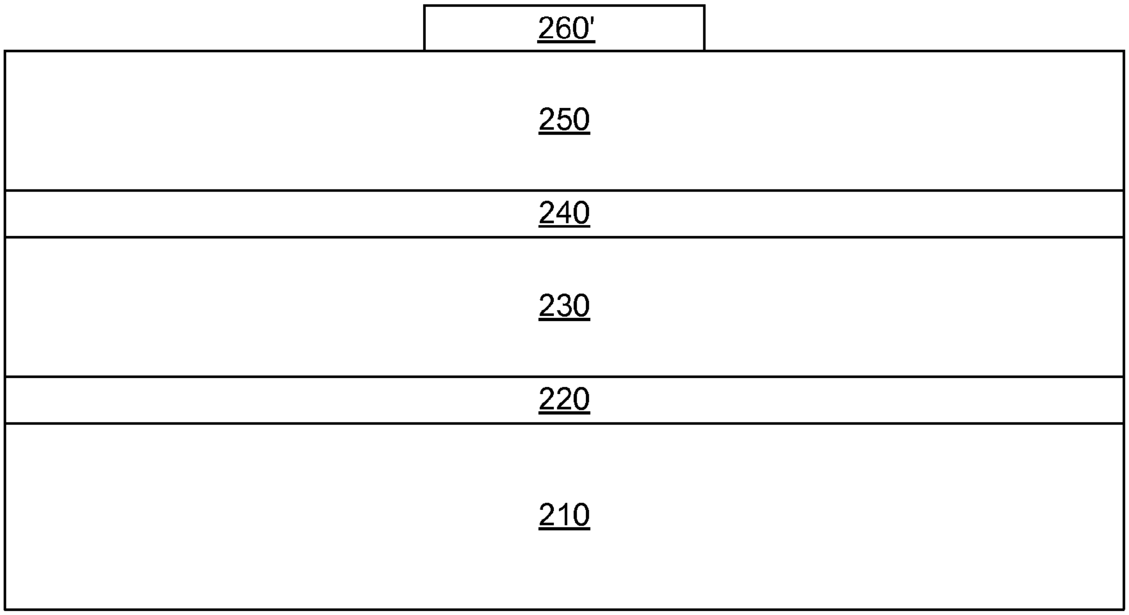
Figure 19:
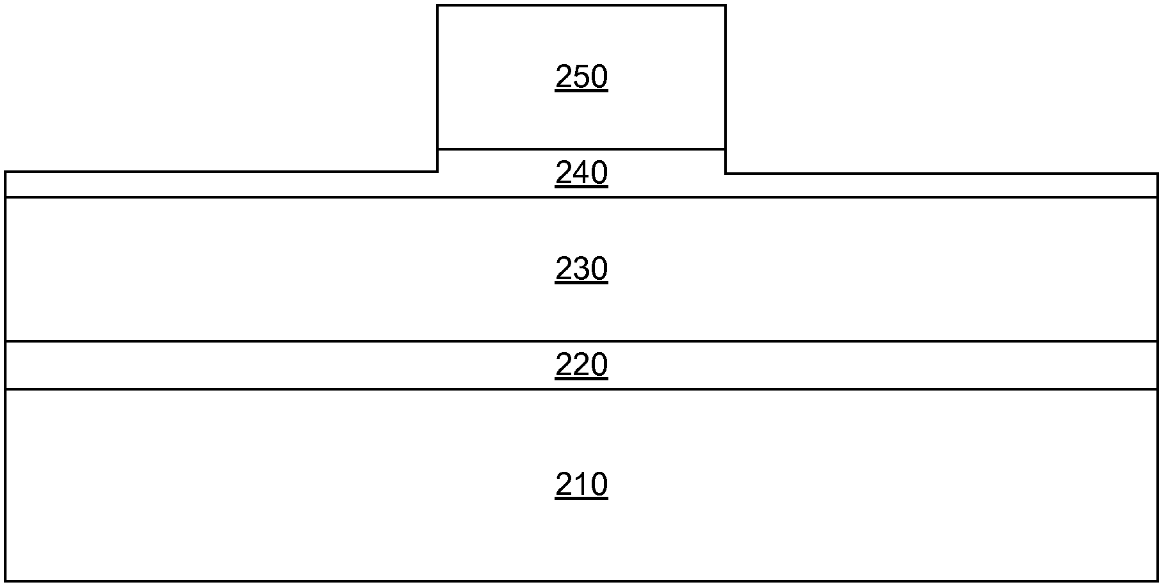

Another embodiment of a process for making a semiconductor device is reflected in FIGS. 17 through 24A,B. FIG. 17 is identical with FIG. 1 and FIG. 18 is identical with FIG. 2. The explanation of FIG. 17 corresponds to the explanation of FIG. 1 which has been provided above. Likewise, the explanation of FIG. 18 is identical with FIG. 2 which has been provided above. Referring to FIG. 19, the control gate layer 250' is masked and etched to form the control gate layer 250' (which is an etched portion of the control gate layer 250). The etch of the control gate layer 250 may be performed by a dry etch such as a dry plasma etch. The dry etch may be a reactive ion etch (RIE). The etch may be an anisotropic etch. In one or more embodiments, the etch of the control gate layer 250 may stop on or at least partially within the second dielectric layer 240. In on or more embodiments, the etch of the control gate layer 250 may also go through the second dielectric layer 240.

Figure 20:
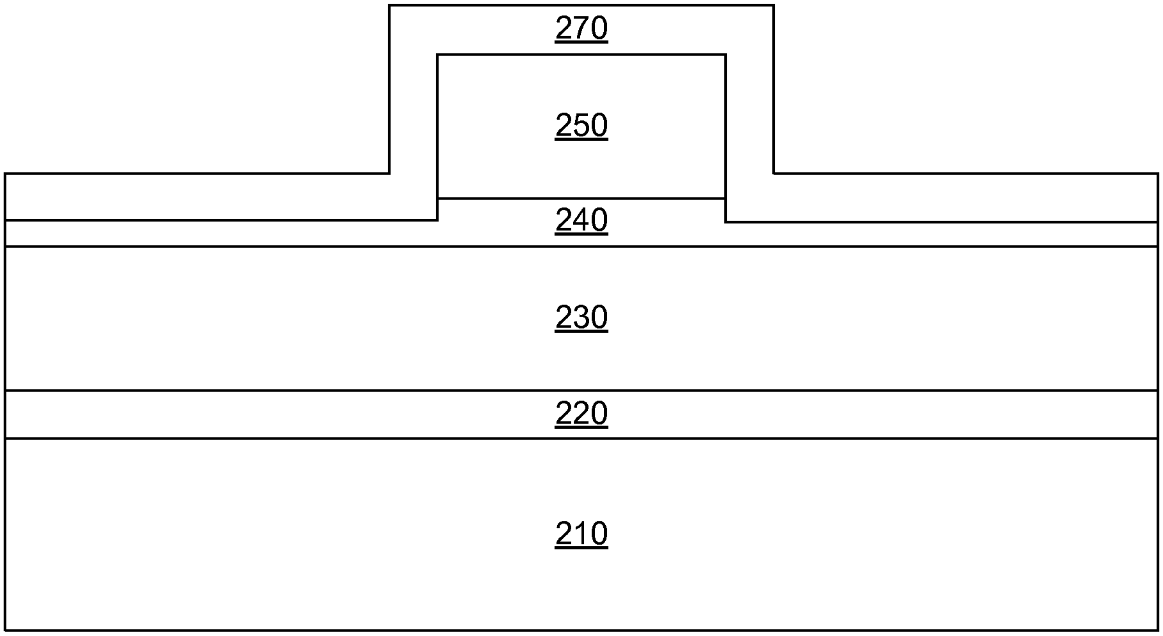

Referring to FIG. 20, in a subsequent processing step, a dielectric layer 270 may be formed over the structure shown in FIG. 19 to form the structure shown in FIG. 20. The dielectric layer 270 may be formed by either a growth process or by a deposition process. The deposition process may be a conformal deposition process. The dielectric layer 270 may be formed on the top and sidewall surface(s) of the control gate layer 250' as well as over the exposed portions of the second dielectric layer 240. When a growth process is used, it is possible that the dielectric layer 270 may not substantially grow on the exposed surfaces of the second dielectric layer 240.

Generally, the dielectric layer 270 may comprise any dielectric material. In one or more embodiments, the dielectric layer 270 may comprise an oxide (such as silicon dioxide $SiO_2$), a nitride (such as $Si_3N_4$ or $Si_xN_y$) an oxynitride (such as silicon oxynitride, S—O—N or $SiO_xN_y$), or combinations thereof. In one or more embodiments, the dielectric layer 270 may comprise a stack of two or more layers (or a stack of three or more layers) such as an oxide/nitride stack such as a $SiO_2/Si_3N_4$ or an $SiO_2/Si_xN_y$ stack or a nitride/oxide stack, an oxide/nitride/oxide stack (for example, an ONO stack) or combinations thereof. In one or more embodiments, the third dielectric layer 270 may comprise a high-k dielectric material.

Figure 21:
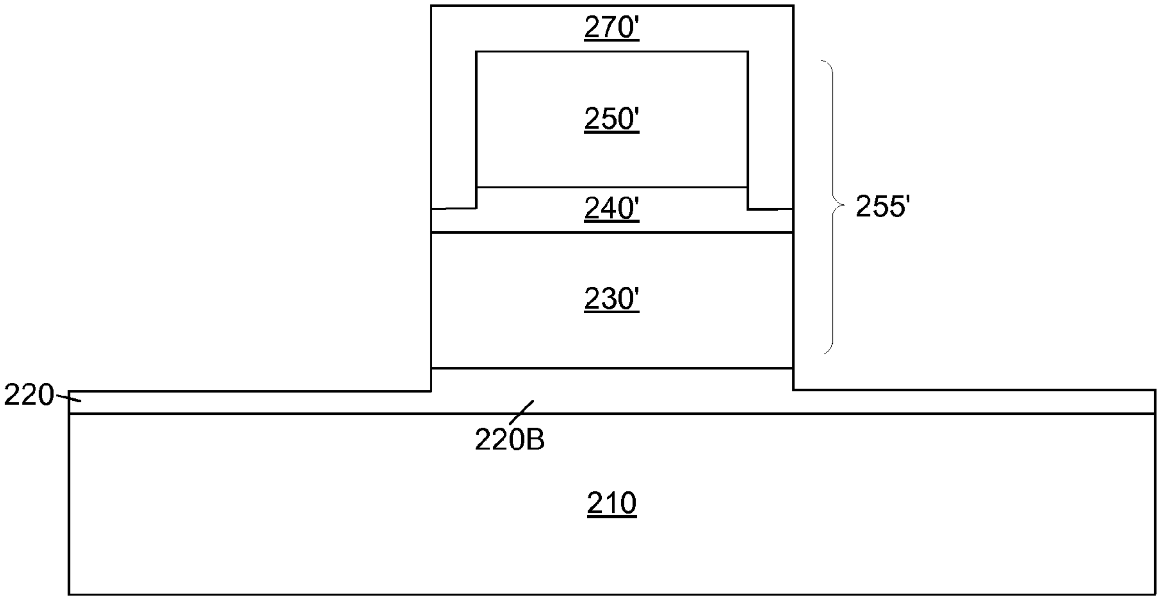

Referring to FIG. 21, using the control gate layer 250' and, optionally, the layer 270 as a mask, the second dielectric layer 240 as well as the charge storage layer 230 are then etched to form to form the structure shown in FIG. 21. The etch forms the gate stack 255'. The gate stack 255' may comprise the control gate layer 250' which is a portion of the control gate layer 250. The control gate stack 255' may comprise the second dielectric layer 240' which is a portion of the second dielectric layer 240. The control gate 255' may comprise the charge storage layer 230' which is a portion of the charge storage layer 230. The control gate layer 250' may also be referred to as the control gate.

The etch used to form the structure shown in FIG. 21 may be a dry etch such as a dry plasma etch. The etch may be a reactive ion etch (RIE). The etch may be an anisotropic etch. The etch may stop on or at least partially within the first dielectric layer 220. The first dielectric layer 220 may thus include a portion 220B directly underlying the gate stack 255'.

Figure 22:
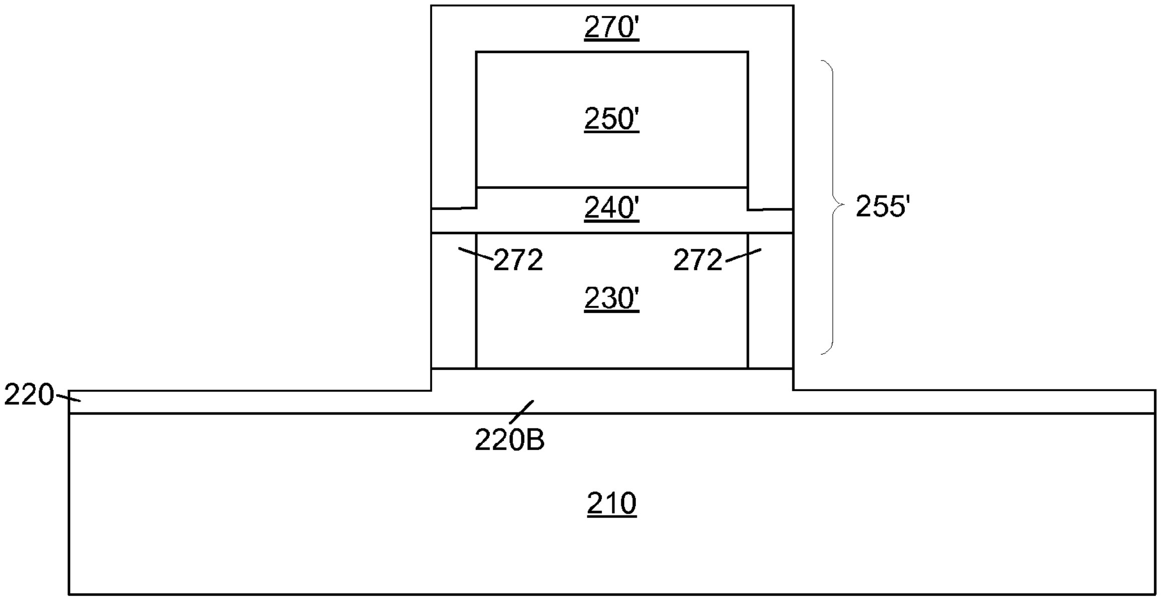

Referring to FIG. 22, an oxidation process (such as a high temperature oxidation process) may follow which may form one or more oxide layers 272 on the one or more sidewalls of the charge storage layer 230'. The oxide layer 272 may line the sidewalls of the charge storage layer 230' and, in one or embodiments, may serve to encapsulate the charge storage layer 230'. In one or more embodiments, the oxide layers 272 may extend from the dielectric layer 240' to the dielectric layer 220B. In one or more embodiments, the oxide layers 272 may extend from the dielectric layer 270' to the dielectric layer 220B. In one or more embodiments, the oxide layers 272 may be replaced by, more generally, another type of dielectric material.

Figure 23:
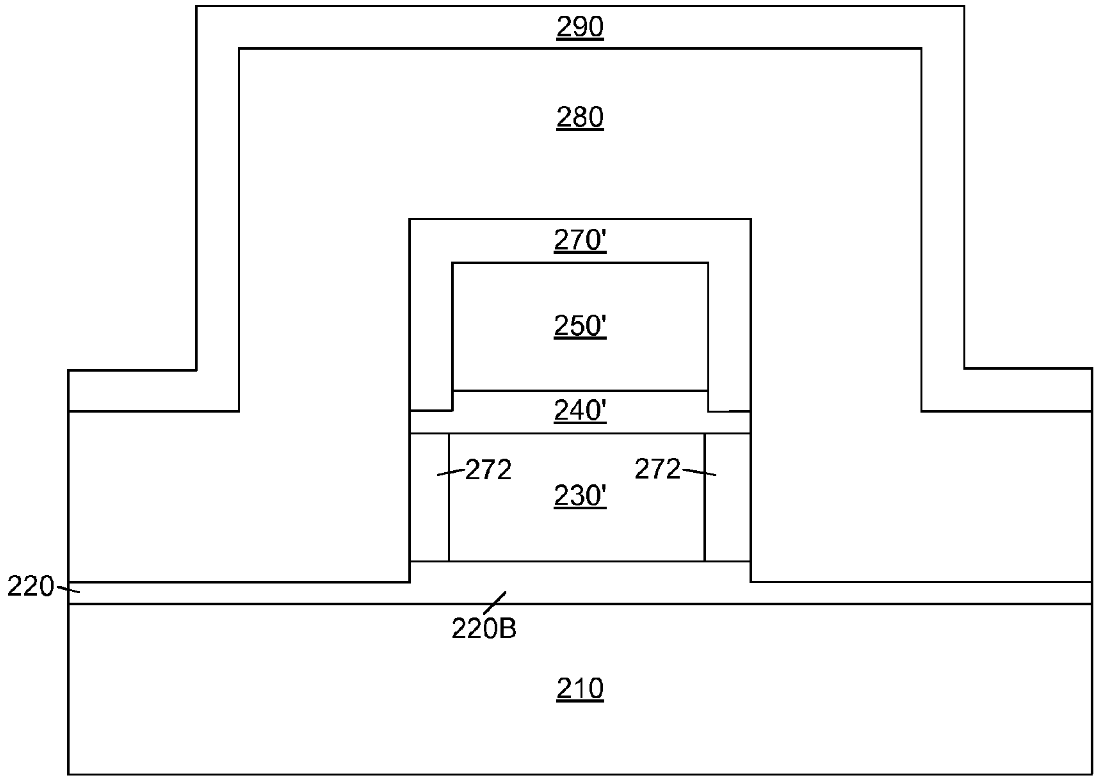

Referring to FIG. 23, a select gate layer 280 may be formed over the structure shown in FIG. 22. Referring to FIG. 23, it is seen that the select gate layer 280 may be formed over the dielectric layer 270' and over the gate stack 255'. The select gate layer 280 may be formed in any way, included, but limited to, by a deposition process or a growth process. The deposition process may be a substantially conformal deposition process. The select gate layer 280 has been described above and may comprise any of the materials described above.

Still referring to FIG. 23, an additional layer 290 may be formed over the select gate layer 280. The additional layer 290 may be formed in any way, including, but not limited to, by a deposition process or a growth process. The deposition process may be a substantially conformal deposition process. The additional layer 290 has been described above and may include any of the materials described above. The additional layer 290 may include, without limitation, any of the carbon materials described above.

Figure 24:
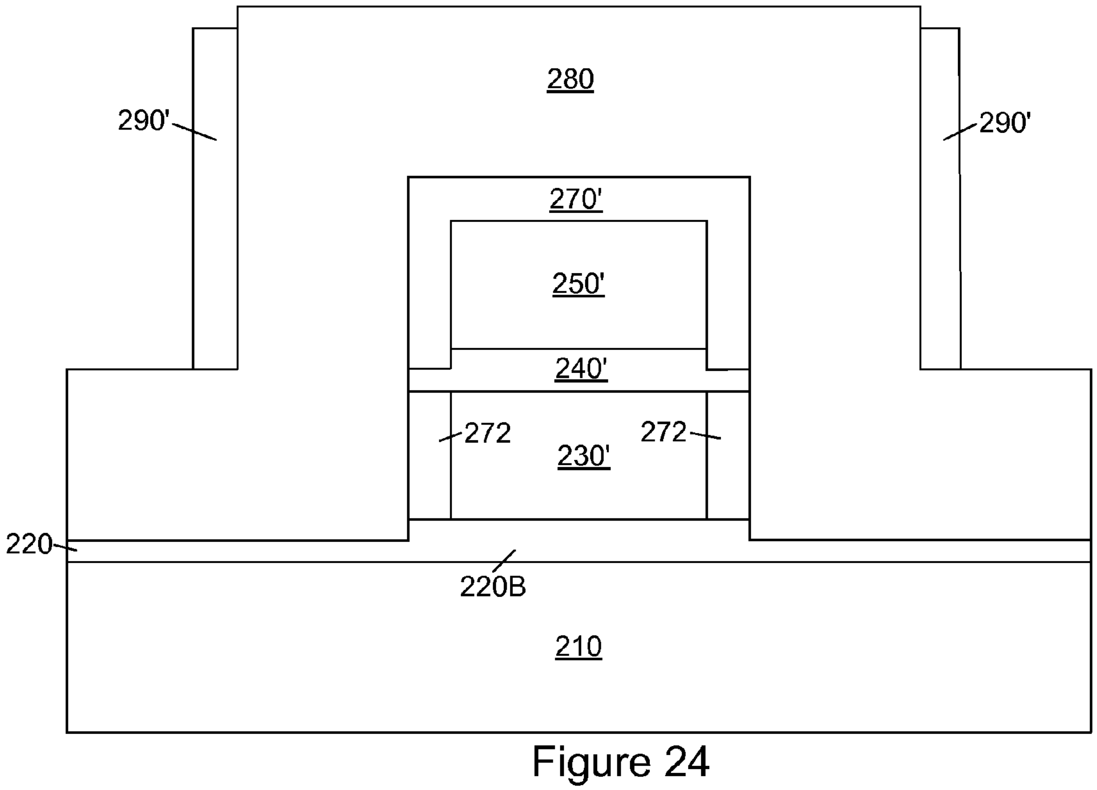

Referring to FIG. 24, the additional layer 290 shown in FIG. 23 may be etched to remove one or more portions of the additional layer 290. The additional layer 290 may be etched so as to remove one or more portions of the layer 290 that are horizontally disposed. The additional layer 290 may be etched using an anisotropic etch. The additional layer 290 may be etched using a dry etch. The dry etch may be a plasma etch. The dry etch may be a reactive ion etch (RIE). The etch may include a reactive chemical process and/or a physical process using ion bombardment. The remaining portions of the layer 290 shown in FIG. 23, may form the sidewall spacers 290' shown in FIG. 24.

Figure 25:
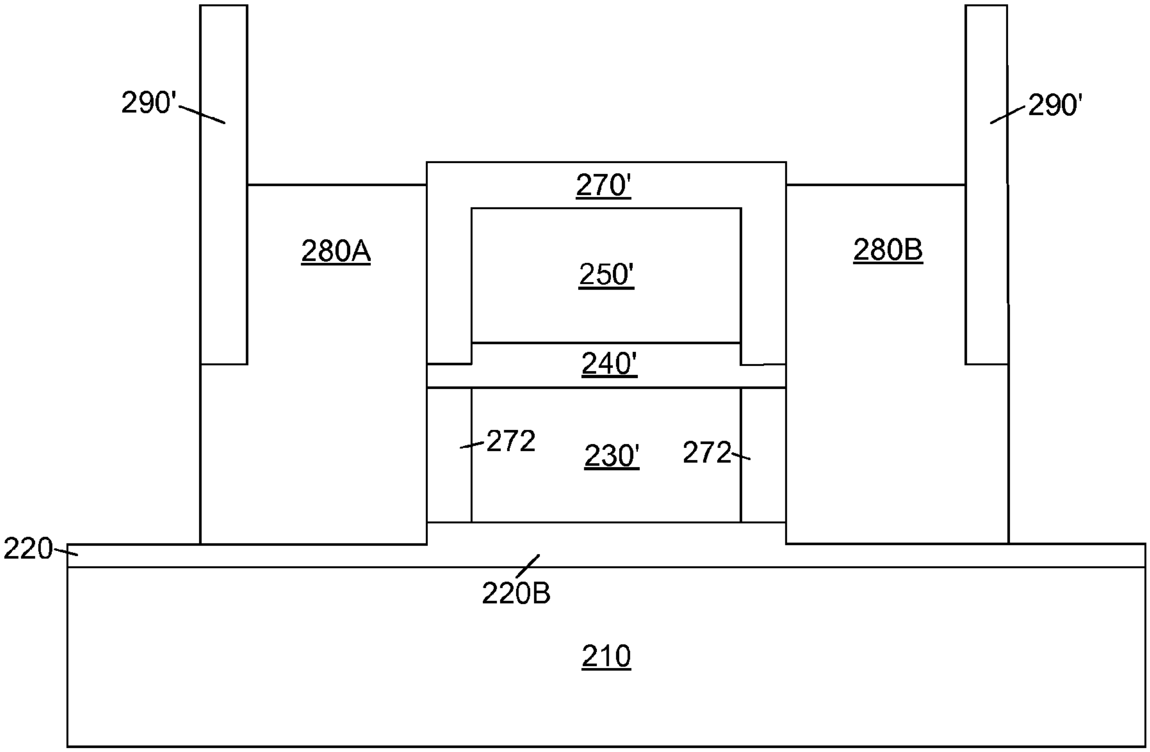

Referring to FIG. 25, the select gate layer 280 shown in FIG. 24 may then be etched to form the structure shown in FIG. 25. The select gate layer 280 may be etched using an anisotropic etch. The etch may be a dry etch such as a dry plasma etch. The dry etch may be a plasma etch. The dry etch may be a reactive ion etch (RIE). The etch may include a reactive chemical process and/or a physical process using ion bombardment. The etch chemistry used may be one which can more easily etch the select gate layer 280 and less easily etch the sidewall spacers 290'. The etch may be selective to the select gate layer 280 relative to sidewall spacers 290'. In one or more embodiments, the select gate layer 280 may comprise polysilicon while the sidewall spacers 290' may comprise a carbon material such as, without limitation, amorphous carbon, graphite, graphene or silicon carbide. Other possible carbon materials are described herein.

As a result of the etch two select gate layers 280A,B are formed on either side of the gate stack 255' as shown in FIG. 25. Each of the select gate layers 280A,B may be adjacent to layer 270' and laterally disposed from a sidewall of the gate structure 255'. Each of the select gate layers 280A,B may also be referred to as a select gate 280A,B.

Figure 26:
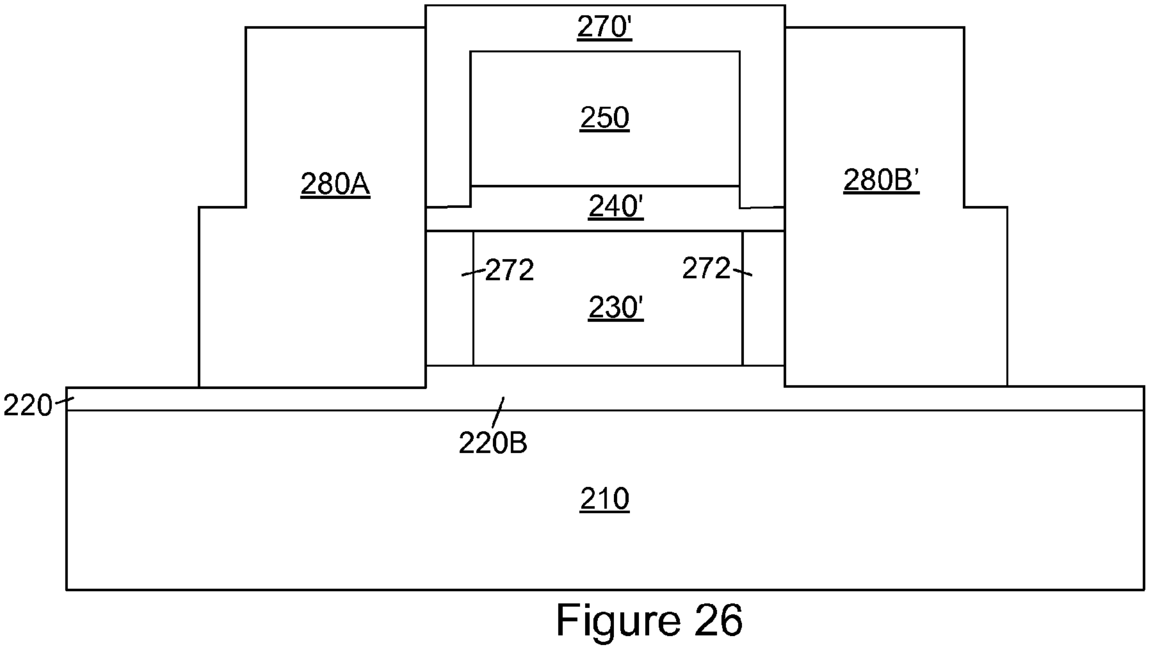

Referring to FIG. 26, the sidewall spacers 290' may then be removed. The removal may be accomplished using an etching process. The etching process may comprise a wet etching process.

Figure 27A:
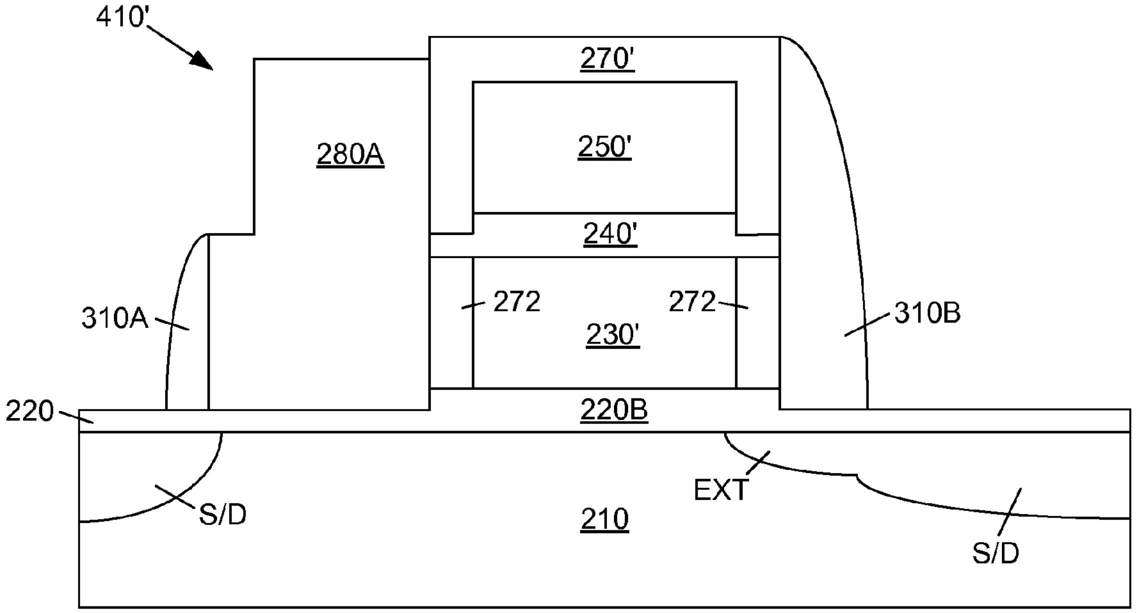
Figure 27B:
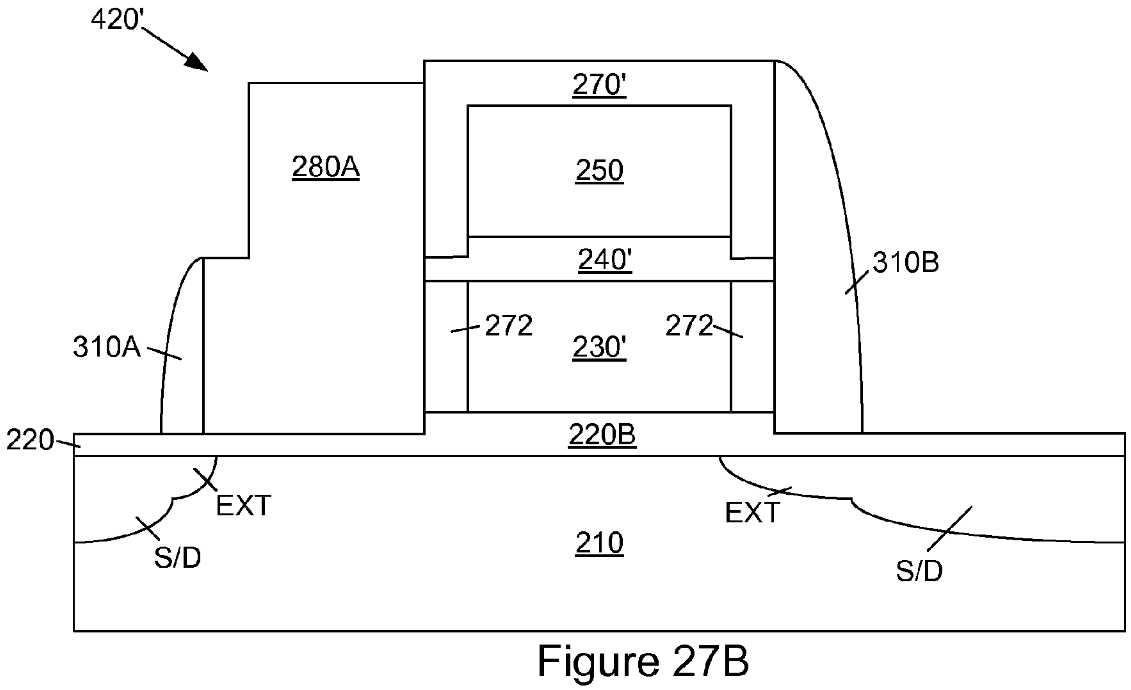

The structure shown in FIG. 26 may be similar to (but not necessarily identical with) that shown in FIG. 9. The remaining process steps may be similar to or the same as those shown in FIGS. 10 through 16A,B. The resulting structures 410', 420' are shown in FIGS. 27A,B, respectively. FIG. 27A shows a device structure 410'. The process steps used to form the device structure 410' may be similar to or the same as those shown in FIGS. 10, 11, 12A, 13A, 14A, 15A and 16A. FIG. 27B shows a device structure 420'. The process steps used to form the device structure 420' may be similar to or the same as those shown in FIGS. 10, 11, 12B, 13B, 14B, 15B and 16B.

The semiconductor device 410' shown in FIG. 27A as well as the semiconductor device 420' shown in FIG. 27B includes a charge storage layer 230', a control gate 250' and a select gate 280A.

In one or more embodiments, the semiconductor device 410' shown in FIG. 27A and the semiconductor device 420' shown in FIG. 27B may each be useful as memory devices such as a charge storage memory device. The memory device 410' shown in FIG. 27A and the memory device 420' shown in FIG. 27B each include a charge storage layer 230', a control gate 250' and a select gate 280A. The discussion above concerning the device 410 is applicable to device 410'. Likewise, the discussion above concerning the device 420 is applicable to device 420'.

One or more embodiments may relate to a method for making a semiconductor device, comprising: providing a substrate; forming a charge storage layer over said substrate; forming a control gate layer over said charge storage layer; forming a mask over said control gate layer; etching said control gate layer and said charge storage layer; forming a select gate layer over said etched control gate layer and said etched charge storage layer; forming an additional layer over said select gate layer; etching said additional layer to form sidewall spacers over said select gate layer; and etching said select gate layer.

One or more embodiments may relate to a method for making a semiconductor device, comprising: providing a substrate; forming a charge storage layer over the substrate; forming a control gate layer over the charge storage layer; forming a gate stack, the forming the gate stack including forming a mask over the control gate layer; and etching the control gate layer and the charge storage layer; and forming a select gate, the forming select gate including forming a select gate layer over the etched control gate layer and the etched charge storage layer; forming an additional layer over the select gate layer; etching the additional layer to form sidewall spacers over the select gate layer; and etching the select gate layer.

One or more embodiments may relate to a method for making a semiconductor device, comprising: providing a substrate; forming a charge storage layer over the substrate; forming a control gate layer over the charge storage layer; forming a mask over the control gate layer; etching the control gate layer; using the etched control gate layer as a mask, etching the charge storage layer; forming a select gate layer over the etched control gate layer and the etched charge storage layer; forming an additional layer over the select gate layer, the additional layer comprising carbon; etching the additional layer to form sidewall spacers over the select gate layer; and etching the select gate layer.

In one or more embodiments, it is possible that one or more embodiments of the methods described herein may provide a more cost effective and/or more efficient means of making one or more semiconductor devices.

Although the invention has been described in terms of certain embodiments, it will be obvious to those skilled in the art that many alterations and modifications may be made without departing from the invention. Accordingly, it is intended that all such alterations and modifications be included within the spirit and scope of the invention.

What is claimed is:

1. A method for making a semiconductor device, comprising:
- providing a substrate;
- forming a charge storage layer over said substrate;
- forming a control gate layer over said charge storage layer;
- forming a first mask over said control gate layer;
- etching said control gate layer and said charge storage layer;
- forming a select gate layer over said etched control gate layer and said etched charge storage layer;
- forming an additional layer over said select gate layer, said additional layer comprising a carbon material;
- etching said additional layer to form sidewall spacers over said select gate layer; and
- etching said select gate layer using said sidewall spacers as a second mask.

2. The method of claim 1, further comprising forming a dielectric layer over said etched control gate layer and said etched charge storage layer before forming said select gate layer.

3. The method of claim 1, wherein said carbon material comprises one or more materials selected from the group consisting of amorphous carbon and silicon carbide.

4. The method of claim 1, wherein said carbon material comprises amorphous carbon.

5. The method of claim 1, wherein said additional layer comprises a dielectric.

6. The method of claim 5, wherein said dielectric includes one or more materials selected from the group consisting of oxide, nitride, and oxynitride.

7. The method of claim 1, wherein said forming said select gate layer comprises a substantially conformal deposition process.

8. The method of claim 1, wherein said forming said additional layer comprises a substantially conformal deposition process.

9. The method of claim 1, wherein said semiconductor device is a charge storage memory device including a control gate, a charge storage layer and a select gate.

10. The method of claim 1, wherein said select gate layer comprises a polysilicon material.

11. A method for making a semiconductor device, comprising:
- providing a substrate;
- forming a charge storage layer over said substrate;
- forming a control gate layer over said charge storage layer;

- forming a gate stack, said forming said gate stack including
  - forming a first mask over said control gate layer; and
  - etching said control gate layer and said charge storage layer; and
- forming a select gate, said forming select gate including
  - forming a select gate layer over said etched control gate layer and said etched charge storage layer;
  - forming an additional layer over said select gate layer, said addition layer comprising a carbon material;
  - etching said additional layer to form sidewall spacers over said select gate layer; and
  - etching said select gate layer using said sidewall spacers as a second mask.

12. The method of claim 11, further comprising forming a dielectric layer over said etched control gate layer and said etched charge storage layer before forming said select gate layer.

13. The method of claim 11, wherein said carbon material comprises one or more materials selected from the group consisting of amorphous carbon and silicon carbide.

14. The method of claim 11, wherein said carbon material comprises amorphous carbon.

15. The method of claim 11, wherein said additional layer comprises a dielectric.

16. The method of claim 15, wherein said dielectric includes one or more materials selected from the group consisting of oxide, nitride, and oxynitride.

17. The method of claim 11, wherein said forming said select gate layer comprises a substantially conformal deposition process.

18. The method of claim 11, wherein said forming said additional layer comprises a substantially conformal deposition process.

19. The method of claim 11, wherein said semiconductor device is a charge storage memory device including a control gate, a charge storage layer and a select gate.

20. The method of claim 11, wherein said select gate layer comprises a polysilicon material.

21. The method of claim 1, wherein said mask comprises a photoresist material.

22. The method of claim 11, wherein said mask comprises a photoresist material.

23. The method of claim 1, further comprising removing said first mask after etching said charge storage layer.

24. The method of claim 11, further comprising removing said first mask after etching said charge storage layer.

25. The method of claim 1, wherein said carbon material comprises a carbon allotrope.

26. The method of claim 11, wherein said carbon material comprises a carbon allotrope.

27. The method of claim 1, wherein said carbon material consists essentially of carbon and silicon.

28. The method of claim 1, wherein said carbon material consists essentially of carbon.

* * * * *